US011410863B2

(12) United States Patent
Shimai et al.

(10) Patent No.: US 11,410,863 B2
(45) Date of Patent: Aug. 9, 2022

(54) SUBSTRATE PROCESSING DEVICE INCLUDING HEATER BETWEEN SUBSTRATE AND SPIN BASE

(71) Applicant: SCREEN Holdings Co., Ltd., Kyoto (JP)

(72) Inventors: Motoyuki Shimai, Kyoto (JP); Toyohide Hayashi, Kyoto (JP); Akito Hatano, Kyoto (JP)

(73) Assignee: SCREEN Holdings Co., Ltd.

( * ) Notice: Subject to any disclaimer, the term of this patent is extended or adjusted under 35 U.S.C. 154(b) by 727 days.

(21) Appl. No.: 16/328,771

(22) PCT Filed: May 25, 2017

(86) PCT No.: PCT/JP2017/019610
§ 371 (c)(1),
(2) Date: Feb. 27, 2019

(87) PCT Pub. No.: WO2018/055835
PCT Pub. Date: Mar. 29, 2018

(65) Prior Publication Data
US 2019/0198363 A1    Jun. 27, 2019

(30) Foreign Application Priority Data

Sep. 23, 2016 (JP) .............................. JP2016-186148

(51) Int. Cl.
*H01L 21/67* (2006.01)
*H01L 21/677* (2006.01)
(Continued)

(52) U.S. Cl.
CPC .... *H01L 21/67109* (2013.01); *H01L 21/6715* (2013.01); *H01L 21/67028* (2013.01);
(Continued)

(58) Field of Classification Search
CPC ......... H01L 21/68707; H01L 21/68728; H01L 21/68764; H01L 21/68785;
(Continued)

(56) References Cited

U.S. PATENT DOCUMENTS

| 2005/0011441 A1 | 1/2005 | Kannan ......................... 118/715 |
| 2011/0048469 A1 | 3/2011 | Ogata et al. ..................... 134/33 |

(Continued)

FOREIGN PATENT DOCUMENTS

| JP | H09-290197 A | 11/1997 |
| JP | 11-340236 A | 12/1999 |

(Continued)

OTHER PUBLICATIONS

International Preliminary Report on Patentability (Chapter I) dated Apr. 4, 2019 with Notification from the International Bureau (Form PCT/IB/326) in corresponding PCT International Application No. PCT/JP2017/019610 in Japanese.

(Continued)

*Primary Examiner* — John P. Dulka
(74) *Attorney, Agent, or Firm* — Ostrolenk Faber LLP

(57) ABSTRACT

A substrate processing device is provided with: a spin base disposed below a substrate grasped by a plurality of chuck members, the spin base transmitting the drive force of a spin motor to the chuck members; and a nozzle for supplying a processing fluid for processing the substrate to the top surface and/or bottom surface of the substrate. An IH heating mechanism of the substrate processing device has: a heat-generating member disposed between the substrate and the spin base; a heating coil disposed below the spin base; and an IH circuit for supplying electric power to the heating coil, whereby an alternating magnetic field applied to the heat-generating member is generated, and the heat-generating member is caused to generate heat.

16 Claims, 18 Drawing Sheets

(51) Int. Cl.
*H01L 21/687* (2006.01)
*H05B 6/10* (2006.01)

(52) U.S. Cl.
CPC .. *H01L 21/67051* (2013.01); *H01L 21/67248* (2013.01); *H01L 21/67748* (2013.01); *H01L 21/68707* (2013.01); *H01L 21/68728* (2013.01); *H01L 21/68764* (2013.01); *H05B 6/105* (2013.01)

(58) Field of Classification Search
CPC ......... H01L 21/67098; H01L 21/67103; H01L 21/67109; H01L 21/67115
See application file for complete search history.

(56) References Cited

U.S. PATENT DOCUMENTS

| | | | |
|---|---|---|---|
| 2014/0127908 A1 | 5/2014 | Okutani | 438/694 |
| 2014/0290581 A1* | 10/2014 | Kang | H01L 21/67017 118/730 |
| 2015/0258582 A1 | 9/2015 | Hashizume et al. | |
| 2015/0279721 A1 | 10/2015 | Kikumoto et al. | |
| 2016/0214148 A1 | 7/2016 | Okutani et al. | |
| 2019/0295866 A1* | 9/2019 | Yoshida | G03F 7/70716 |
| 2019/0335548 A1* | 10/2019 | Li | H01L 21/67115 |

FOREIGN PATENT DOCUMENTS

| | | |
|---|---|---|
| JP | 2000-133626 A | 5/2000 |
| JP | 2001-035800 A | 2/2001 |
| JP | 2002-334922 A | 11/2002 |
| JP | 2003-306772 A | 10/2003 |
| JP | 2005-011868 A | 1/2005 |
| JP | 2007-042324 A | 2/2007 |
| JP | 2007-335709 A | 12/2007 |
| JP | 2017-071477 A | 4/2011 |
| JP | 2012-089537 A | 5/2012 |
| JP | 2014-112652 A | 6/2014 |
| JP | 2014-136249 A | 7/2014 |
| JP | 2015-170772 A | 9/2015 |
| JP | 2015-188009 A | 10/2015 |
| JP | 2016-136599 A | 7/2016 |
| KR | 10-2012-0077887 A | 7/2012 |
| KR | 10-2015-0070354 A | 6/2015 |

OTHER PUBLICATIONS

English translation of the International Preliminary Report on Patentability (Chapter I) dated Apr. 4, 2019 with Notification from the International Bureau (Form PCT/IB/338) in corresponding PCT International Application No. PCT/JP2017/019610.
International Search Report dated Aug. 29, 2017 in corresponding PCT International Application No. PCT/JP2017/019610.
Written Opinion dated Aug. 29, 2017 in corresponding PCT International Application No. PCT/JP2017/019610.

* cited by examiner

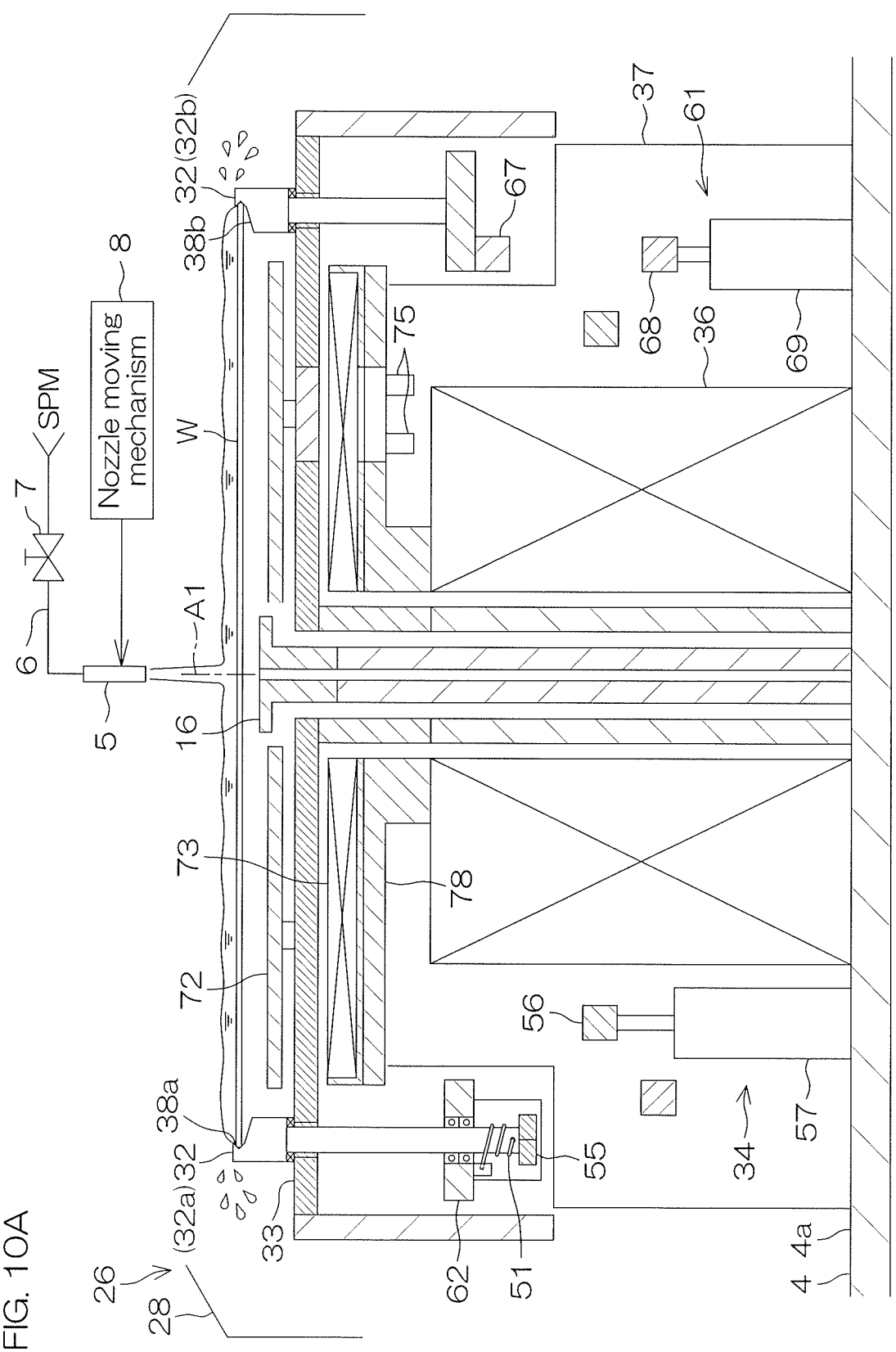

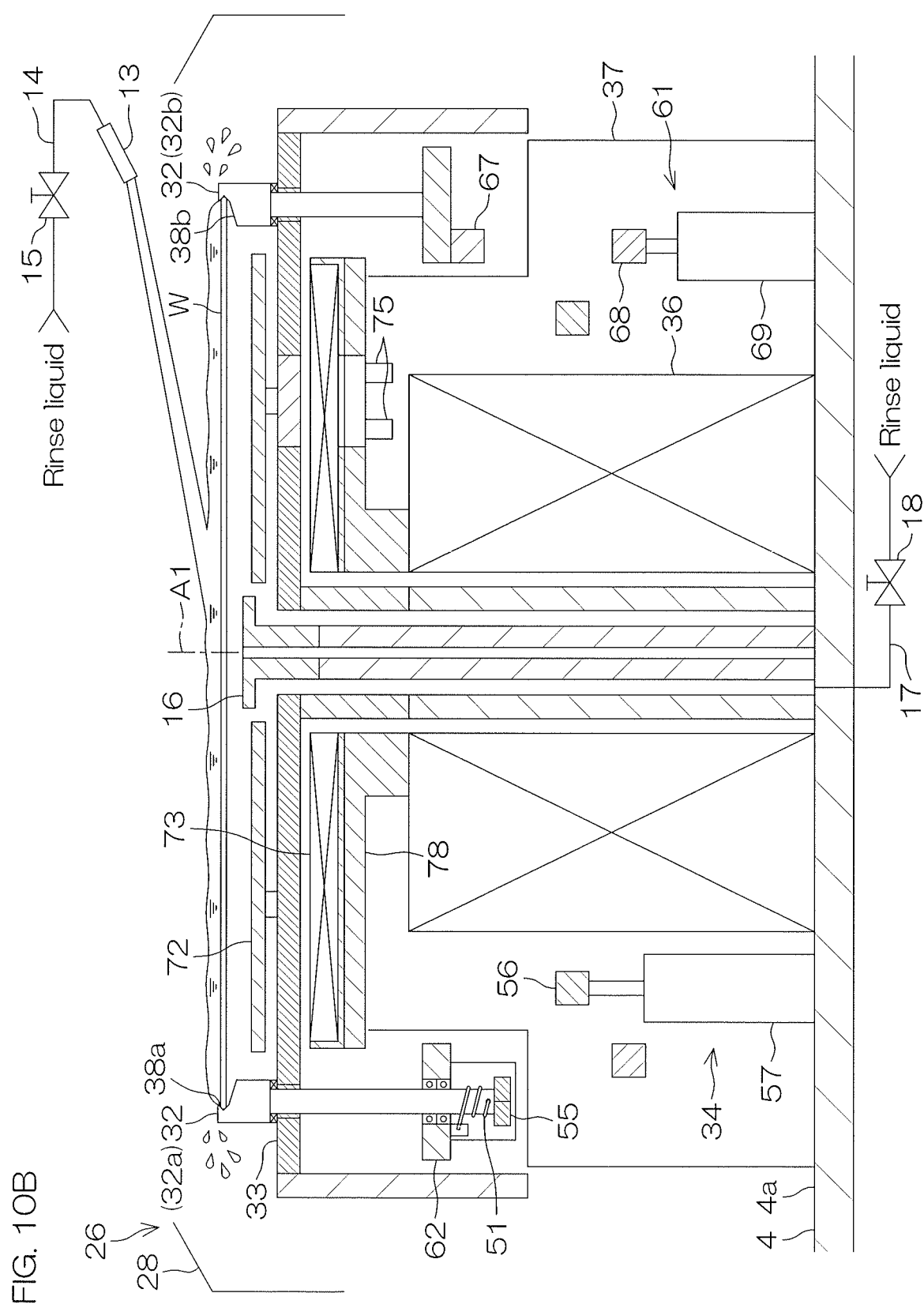

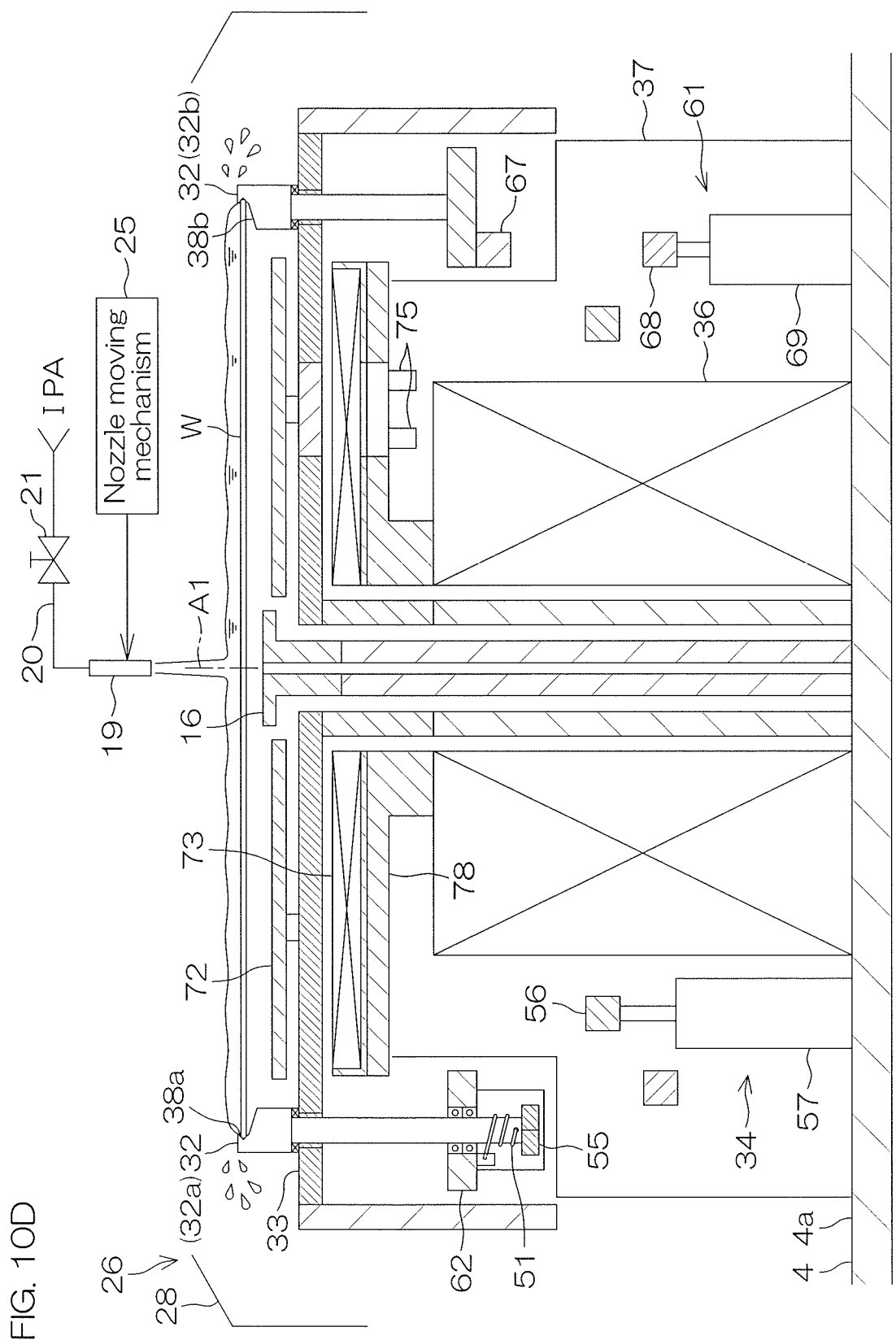

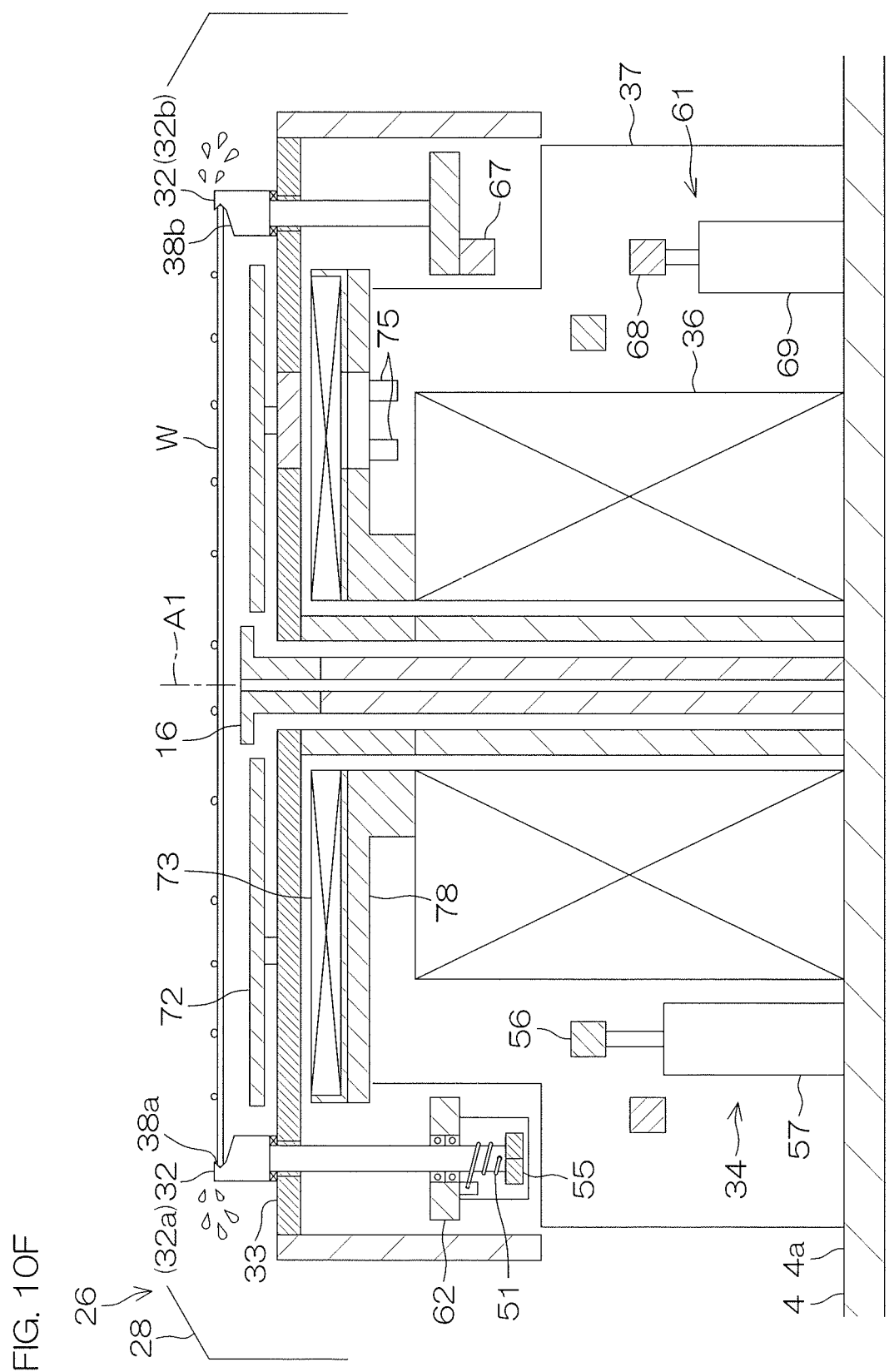

SUBSTRATE PROCESSING DEVICE INCLUDING HEATER BETWEEN SUBSTRATE AND SPIN BASE

CROSS-REFERENCE TO RELATED APPLICATIONS

The present application is a 35 U.S.C. §§ 371 national phase conversion of PCT/JP2017/019610, filed May 25, 2017, which claims priority to Japanese Patent Application No. 2016-186148, filed Sep. 23, 2016, the contents of both of which are incorporated herein by reference. The PCT International Application was published in the Japanese language.

TECHNICAL FIELD

The present invention relates to a substrate processing apparatus which processes a substrate. Substrates to be processed include, for example, semiconductor wafers, substrates for liquid crystal displays, substrates for plasma displays, substrates for FEDs (field emission displays), substrates for optical disks, substrates for magnetic disks, substrates for magneto-optical disks, substrates for photomasks, ceramic substrates, substrates for solar cells, etc.

BACKGROUND ART

In a manufacturing process of a semiconductor device, a liquid crystal display, etc., there is a case where a processing fluid is supplied to a substrate while rotating and heating the substrate.

Patent Literature 1 discloses causing a heat generating plate, which is provided inside a spin chuck, to generate heat by applying an alternating magnetic field to the heat generating plate while causing a rotation driving mechanism to rotate the spin chuck which holds a substrate. The substrate is held by the plurality of holding pins projecting upward from an upper surface of the spin chuck. The spin chuck is arranged under the substrate held by the plurality of holding pins. The substrate is heated by the heat generating plate provided inside the spin chuck.

PRIOR ART DOCUMENT

Patent Document

PATENT DOCUMENT 1: JP 2007-335709 A

SUMMARY OF THE INVENTION

Problem(s) to be Solved by the Invention

In Patent Literature 1, the substrate held by the plurality of holding pins is arranged above the spin chuck, and the heat generating plate that heats the substrate is provided inside the spin chuck. Therefore, a distance between the substrate and the heat generating plate is long. Thus, heating efficiency of the substrate is lowered.

Therefore, an object of the present invention is to enhance the heating efficiency of a substrate when a processing fluid is supplied to the substrate while rotating and heating the substrate.

Means for Solving Problems

A preferred embodiment of the present invention provides a substrate processing apparatus including the plurality of chuck members that horizontally grip a substrate by horizontally clamping the substrate with the plurality of gripping portions arranged around the substrate, a spin motor that generates motive power to rotate the substrate about a vertical rotation axis passing through a center portion of the substrate gripped by the plurality of chuck members, a spin base that is arranged under the substrate gripped by the plurality of chuck members and transmits the motive power of the spin motor to the plurality of chuck members, a processing fluid supply unit that supplies at least one of an upper surface and a lower surface of the substrate with a processing fluid with which the substrate gripped by the plurality of chuck members is processed, and an IH heating mechanism that includes a heat generating member arranged between the substrate gripped by the plurality of chuck members and the spin base, a heating coil arranged under the spin base, and an IH (induction heating) circuit that causes the heating coil to generate an alternating magnetic field to be applied to the heat generating member by supplying electric power to the heating coil such that the heat generating member generates heat.

According to this arrangement, the substrate is gripped by the plurality of chuck members. The motive power of the spin motor is transmitted to the plurality of chuck members via the spin base located under the substrate. Thereby, the substrate is rotated about the rotation axis. The IH circuit of the IH heating mechanism supplies electric power to the heating coil when the substrate is rotating. Thereby, the alternating magnetic field is generated and applied to the heat generating member, and the heat generating member generates heat. The processing fluid that processes the substrate is supplied to the rotating substrate. Thereby, it is possible to uniformly process the substrate.

Since the heat generating member is heated by induction heating, there is no need for connecting a wire or a connector that supplies electric power to the heat generating member to the heat generating member. Therefore, rotation speed of the substrate is not limited by such a structure. Further, the heat generating member that heats the substrate is arranged not inside the spin base but between the substrate and the spin base. Therefore, in comparison to a case where a heat generating member is arranged inside a spin base, it is possible to shorten a gap between the substrate and the heat generating member and to enhance heating efficiency of the substrate.

In the preferred embodiment, at least one of the following features may be added to the substrate processing apparatus.

A gap between the heating coil and the spin base in an up-down direction is narrower than a thickness of the heating coil. The thickness of the heating coil indicates a length of the heating coil in the up-down direction.

According to this arrangement, the heating coil is arranged near the spin base. That is, the up-down direction gap between the heating coil and the spin base is narrower than the thickness of the heating coil. The heating coil is arranged under the spin base, and the heat generating member is arranged above the spin base. When the heating coil is brought close to the spin base, a distance from the heating coil to the heat generating member is shortened. Thereby, the alternating magnetic field applied to the heat generating member is strengthened. Thus, it is possible to efficiently convert the electric power to be supplied to the heating coil into heat of the heat generating member.

A thickness of the spin base is smaller than a thickness of the heating coil.

According to this arrangement, the thickness of the spin base is reduced. That is, the thickness of the spin base is smaller than the thickness of the heating coil. When the spin base is thick, not only the distance from the heating coil to the heat generating member is increased but the alternating magnetic field applied to the heat generating member is also weakened. Therefore, by reducing the thickness of the spin base, it is possible to efficiently increase a temperature of the heat generating member.

The thickness of the spin base indicates a length of the spin base in the up-down direction. The thickness of the spin base is a thickness of the spin base within a region between the heat generating member and the heating coil. A thickness of the spin base within other regions may be equal to the thickness of the heating coil or may be shorter or longer than the thickness of the heating coil.

The heat generating member directly faces the substrate gripped by the plurality of chuck members.

According to this arrangement, no other members are placed between the substrate and the heat generating member, and the heat generating member directly faces the substrate. Therefore, the heat of the heat generating member is efficiently transmitted to the substrate. Thereby, it is possible to enhance the heating efficiency of the substrate.

The substrate processing apparatus further includes a gap changing mechanism that changes a gap between the substrate gripped by the plurality of chuck members and the heat generating member in an up-down direction by moving the plurality of chuck members or the heat generating member in the up-down direction.

According to this arrangement, the gap changing mechanism relatively moves the plurality of chuck members and the heat generating member in the up-down direction. Thereby, the up-down direction gap between the substrate gripped by the plurality of chuck members and the heat generating member is changed. Therefore, it is possible to change a distance from the heat generating member to the substrate according to necessity.

The substrate processing apparatus further includes a transfer robot that transfers the substrate to the plurality of chuck members while supporting the substrate by a hand arranged under the substrate, wherein the gap changing mechanism moves the plurality of chuck members or the heat generating member in the up-down direction between a retracted position where the gap between the substrate gripped by the plurality of chuck members and the heat generating member in the up-down direction is wider than a thickness of the hand, and a proximate position where the gap is narrower than the thickness of the hand. The thickness of the hand indicates a length of the hand in the up-down direction.

According to this arrangement, in a retracted state where the plurality of chuck members or the heat generating member is placed at the retracted position, the transfer robot places the substrate supported on the hand onto the plurality of chuck members. Next, the transfer robot lowers and separates the hand from the substrate. After that, the transfer robot retracts the hand from a space between the substrate and the heat generating member. When the substrate is taken from the plurality of chuck members, the hand is inserted into the space between the substrate and the heat generating member in the retracted state. After that, the transfer robot raises the hand. Thereby, the substrate is separated from the plurality of chuck members and supported by the hand.

From the viewpoint of heating efficiency, the heat generating member is preferably arranged near the substrate. However, when the heat generating member is too close to the substrate, the hand cannot enter the space between the substrate and the heat generating member. Thus, the substrate cannot be placed on the plurality of chuck members or cannot be taken from the plurality of chuck members. As described above, the substrate is transferred in the retracted state. Meanwhile, the substrate is heated in a proximate state where the plurality of chuck members or the heat generating member is placed at the proximate position. Therefore, without lowering the heating efficiency of the substrate, it is possible to transfer the substrate.

The gap changing mechanism moves the plurality of chuck members in the up-down direction with respect to the spin base, and the plurality of chuck members include a movable chuck movable with respect to the spin base between a closed position where the movable chuck is pressed against an outer circumferential portion of the substrate and an open position where the pressing of the movable chuck against the outer circumferential portion of the substrate is released.

According to this arrangement, the plurality of chuck members include the movable chuck movable between the closed position and the open position with respect to the spin base. The up-down direction gap between the substrate and the heat generating member is changed by moving the plurality of chuck members in the up-down direction with respect to the spin base. Therefore, the movable chuck is not only movable between the closed position and the open position with respect to the spin base but also movable in the up-down direction with respect to the spin base. In such a way, there is no need for moving the heat generating member in the up-down direction in order to change the up-down direction gap between the substrate and the heat generating member. Thus, it is possible to simplify a structure of supporting the heat generating member.

The gap changing mechanism moves the heat generating member in the up-down direction with respect to the spin base.

According to this arrangement, the up-down direction gap between the substrate and the heat generating member is changed by moving the heat generating member in the up-down direction with respect to the spin base. In such a way, there is no need for moving the plurality of chuck members in the up-down direction in order to change the up-down direction gap between the substrate and the heat generating member. Thus, it is possible to simplify a structure of supporting the plurality of chuck members.

The substrate processing apparatus further includes a magnetic shielding member that shields the alternating magnetic field generated by supplying the electric power to the heating coil, and includes a tubular outer wall portion that surrounds the heating coil, and a lower wall portion that is located under the heating coil.

According to this arrangement, the outer wall portion of the magnetic shielding member that absorbs magnetism surrounds the heating coil. Further, the lower wall portion of the magnetic shielding member that absorbs magnetism is located under the heating coil. Therefore, it is possible to suppress or eliminate the influence of the alternating magnetic field on the members placed around the heating coil. Similarly, it is possible to suppress or eliminate the influence of the alternating magnetic field on the members located under the heating coil.

The substrate processing apparatus further includes a thermometer that detects a temperature of the heat generating member, and a controller that controls the IH heating mechanism based on a detection value of thermometer.

According to this arrangement, the detection value of thermometer that detects the temperature of the heat generating member is input to the controller. The controller controls the electric power supplied to the heating coil based on this detection value. Thereby, it is possible to bring the temperature of the heat generating member close to a target temperature with a high degree of accuracy.

Thermometer is preferably a non-contact thermometer that detects the temperature of the heat generating member in a non-contact manner with the heat generating member. An example of such a thermometer is a radiation thermometer that detects a temperature of an object by detecting intensity of an infrared ray or a visible light emitted from the object.

The fluid supply unit includes a lower surface nozzle that is arranged, in a plan view, within a through hole passing through the heat generating member in the up-down direction, and the lower surface nozzle discharges the processing fluid toward the lower surface of the substrate gripped by the plurality of chuck members.

According to this arrangement, the lower surface nozzle discharges the processing fluid toward the lower surface of the substrate. The lower surface nozzle is arranged, in a plan view, within the through hole passing through the center portion of the heat generating member in the up-down direction. Therefore, it is possible to suppress or prevent the heat generating member from obstructing the processing fluid discharged from the lower surface nozzle. Thereby, it is possible to reliably supply the processing fluid to the lower surface of the substrate.

As long as the lower surface nozzle is arranged, in a plan view, within the through hole of the heat generating member, a discharge port of the lower surface nozzle from which the processing fluid is discharged may be arranged at a height equal to an upper surface of the heat generating member or may be arranged at a position higher or lower than the upper surface of the heat generating member.

The plurality of chuck members include a movable chuck that is movable with respect to the spin base about a vertical chuck turning axis between a closed position where the movable chuck is pressed against an outer circumferential portion of the substrate and an open position where the pressing of the movable chuck against the outer circumferential portion of the substrate is released. The chuck turning axis may be the center line of the movable chuck or may be a straight line different from the center line of the movable chuck.

According to this arrangement, the movable chuck is turned about the vertical chuck turning axis. In this case, in comparison to a case where the chuck turning axis is a horizontal straight line, the volume of a passage space through which the movable chuck passes is easily reduced. In particular, in a case where the chuck turning axis matches the center line of the movable chuck, it is possible to make the volume of the passage space match or substantially match the volume of the movable chuck.

The plurality of chuck members include a movable chuck that is movable with respect to the spin base about a horizontal chuck turning axis between a closed position where the movable chuck is pressed against an outer circumferential portion of the substrate and an open position where the pressing of the movable chuck against the outer circumferential portion of the substrate is released.

The substrate processing apparatus further includes a chuck opening/closing mechanism that switches the plurality of chuck members between a closed state where the plurality of gripping portions are pressed against the outer circumferential portion of the substrate and an opened state where the pressing of the plurality of gripping portions against the substrate is released by moving the movable chuck between the closed position and the open position, wherein the chuck opening/closing mechanism includes a pressing portion that moves the movable chuck to the open position by pressing the movable chuck upward or downward, and the movable chuck includes a pressed portion to be pressed by the pressing portion.

According to this arrangement, the pressing portion of the chuck opening/closing mechanism is brought into contact with the pressed portion of the movable chuck and presses the pressed portion. Thus, it is possible to reliably open and close the movable chuck.

The chuck opening/closing mechanism further includes an opening/closing actuator that moves the pressing portion in an up-down direction between an upper position where the pressing portion is brought into contact with the pressed portion and a lower position where the pressing portion is separated downward from the pressed portion.

According to this arrangement, when the opening/closing actuator of the chuck opening/closing mechanism raises the pressing portion to the upper position, the pressing portion is brought into contact with the pressed portion of the movable chuck, and presses the pressed portion upward. Thereby, the movable chuck is arranged at the open position. After that, when the opening/closing actuator lowers the pressing portion from the upper position, the pressing portion is separated downward from the pressed portion, and the movable chuck is returned to the closed position. Thereby, it is possible to move the movable chuck between the closed position and the open position.

The substrate processing apparatus further includes a gap changing mechanism that changes a gap between the substrate gripped by the plurality of chuck members and the heat generating member in an up-down direction by moving the plurality of chuck members in the up-down direction with respect to the spin base, wherein the pressing portion is coupled to the spin base such that the pressing portion is located above the pressed portion, and the gap changing mechanism includes a raising/lowering actuator that moves the plurality of chuck members in the up-down direction with respect to the spin base between an upper position where the pressed portion is brought into contact with the pressing portion and a lower position where the pressed portion is separated downward from the pressing portion.

According to this arrangement, when the raising/lowering actuator raises the plurality of chuck members to the upper position, the pressed portion of the movable chuck is brought into contact with the pressing portion coupled to the spin base, and pressed downward. Thereby, the movable chuck is arranged at the open position. After that, when the raising/lowering actuator lowers the plurality of chuck members from the upper position, the pressed portion is separated downward from the pressing portion, and the movable chuck is returned to the closed position. In such a way, the raising/lowering actuator that raises and lowers the plurality of chuck members with respect to the spin base also serves as an opening/closing actuator that moves the movable chuck. Thus, an exclusive opening/closing actuator is not required.

The above and other objects, features, and effects of the present invention will become more apparent from the following detailed description of the preferred embodiments with reference to the attached drawings.

BRIEF DESCRIPTION OF THE DRAWINGS

FIG. 10A is a schematic view showing a state where SPM is supplied to the substrate in the example of the processing of the substrate shown in FIG. 9.

FIG. 10B is a schematic view showing a state where pure water is supplied to the substrate in the example of the processing of the substrate shown in FIG. 9.

FIG. 10D is a schematic view showing a state where IPA is supplied to the substrate in the example of the processing of the substrate shown in FIG. 9.

FIG. 10F is a schematic view showing a state where the substrate is dried in the example of the processing of the substrate shown in FIG. 9.

PREFERRED EMBODIMENTS OF INVENTION

Figure 1:
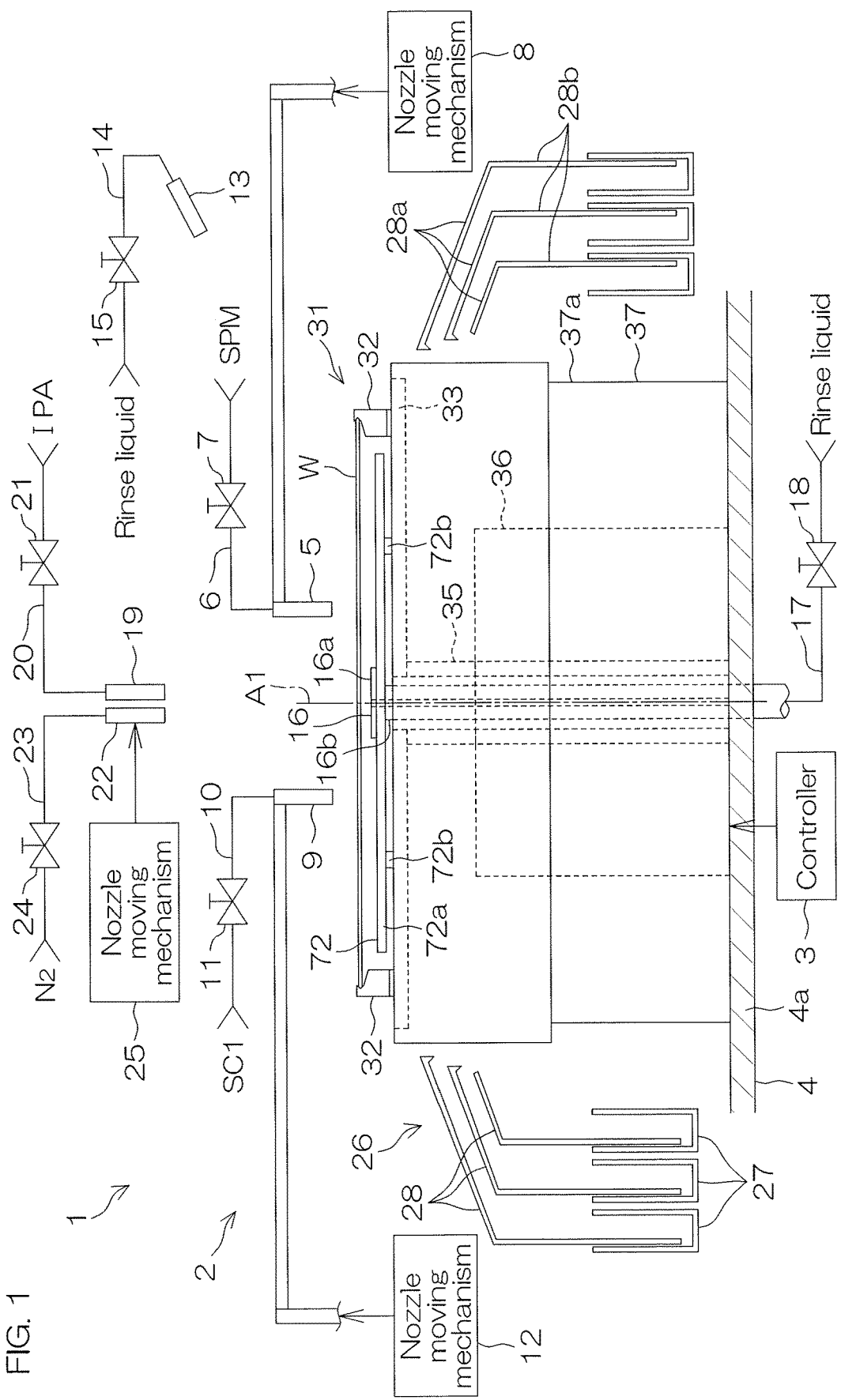
FIG. 1 is a schematic view of an inside of a chamber provided in a substrate processing apparatus according to a first preferred embodiment of the present invention when viewed horizontally.

FIG. 1 is a schematic view of an inside of a chamber 4 provided in a substrate processing apparatus 1 according to a first preferred embodiment of the present invention when viewed horizontally.

The substrate processing apparatus 1 is a single substrate processing type apparatus that processes a disk-shaped substrate W such as a semiconductor wafer one by one. The substrate processing apparatus 1 includes a processing unit 2 that processes a substrate W with a processing fluid such as a processing liquid or processing gas, a transfer robot R1 (refer to FIG. 3) that transfers the substrate W to the processing unit 2, and a controller 3 that controls the substrate processing apparatus 1. The controller 3 is a computer including a memory that stores information such as a program, and a processor that controls the substrate processing apparatus 1 according to the information stored in the memory.

The processing unit 2 includes the box-shaped chamber 4 having an internal space, a spin chuck 31 that rotates a single substrate W about a vertical rotation axis A1 passing through the center portion of the substrate W while holding the substrate W horizontally inside the chamber 4, the plurality of nozzles that discharge various types of fluids toward the substrate W held by the spin chuck 31, and a tubular cup 26 that surrounds a periphery of the spin chuck 31.

The plurality of nozzles include a first chemical liquid nozzle 5 and a second chemical liquid nozzle 6 that discharge chemical liquids toward an upper surface of the substrate W. The first chemical liquid nozzle 5 is connected to a first chemical liquid pipe 6 in which a first chemical liquid valve 7 is interposed. Similarly, the second chemical liquid nozzle 9 is connected to a second chemical liquid pipe 10 in which a second chemical liquid valve 11 is interposed. When the first chemical liquid valve 7 is opened, the chemical liquid is supplied from the first chemical liquid pipe 6 to the first chemical liquid nozzle 5, and discharged from the first chemical liquid nozzle 5. When the first chemical liquid valve 7 is closed, discharge of the chemical liquid from the first chemical liquid nozzle 5 is stopped. The same applies to the second chemical liquid valve 11.

A specific example of the chemical liquid (first chemical liquid) discharged from the first chemical liquid nozzle 5 is SPM (sulfuric acid/hydrogen peroxide mixture). A specific example of the chemical liquid (second chemical liquid) discharged from the second chemical liquid nozzle 9 is SC1 (mixture of ammonia water, hydrogen peroxide water, and water). The first chemical liquid may be phosphoric acid. The first chemical liquid may be a liquid other than SPM and phosphoric acid, the liquid containing at least one of sulfuric acid, nitric acid, hydrochloric acid, hydrofluoric acid, phosphoric acid, acetic acid, ammonia water, hydrogen peroxide water, organic acid (for example, citric acid, oxalic acid, etc.), organic alkali (for example, TMAH (tetramethylammonium hydroxide), etc.), a surfactant, and a corrosion inhibitor. The same applies to the second chemical liquid.

The first chemical liquid nozzle 5 is connected to a first nozzle moving mechanism 8 that moves the first chemical liquid nozzle 5. The second chemical liquid nozzle 9 is connected to a second nozzle moving mechanism 12 that moves the second chemical liquid nozzle 9. The first nozzle moving mechanism 8 moves the first chemical liquid nozzle 5 between a processing position where the first chemical liquid lands on the upper surface of the substrate W and a standby position where the first chemical liquid nozzle 5 is placed around the cup 26 in a plan view. Further, the first nozzle moving mechanism 8 moves a liquid landing position of the first chemical liquid within the upper surface of the substrate W by horizontally moving the first chemical liquid nozzle 5. The same applies to the second nozzle moving mechanism 12.

The plurality of nozzles include a rinse liquid nozzle 13 that discharges a rinse liquid downward to the upper surface center portion of the substrate W. The rinse liquid nozzle 13 is fixed with respect to the chamber 4. The rinse liquid nozzle 13 may be connected to a third nozzle moving mechanism that moves the rinse liquid nozzle 13. The rinse liquid nozzle 13 is connected to a first rinse liquid pipe 14 in which a first rinse liquid valve 15 is interposed. A specific example of the rinse liquid discharged from the rinse liquid nozzle 13 is pure water (deionized water). The rinse liquid may be a rinse liquid other than pure water such as carbonated water, electrolyzed ion water, hydrogen water, ozone water, and aqueous hydrochloric acid solution of dilute concentration (of, for example, approximately 10 to 100 ppm), etc.

The plurality of nozzles include a lower surface nozzle 16 that discharges a rinse liquid upward to the lower surface center portion of the substrate W. The lower surface nozzle 16 is fixed with respect to the chamber 4. The lower surface nozzle 16 is connected to a second rinse liquid pipe 17 in which a second rinse liquid valve 18 is interposed. A specific example of the rinse liquid discharged from the lower surface nozzle 16 is pure water. The rinse liquid may be a rinse liquid other than the pure water described above. The liquid discharged from the lower surface nozzle 16 may be a processing liquid other than the rinse liquid.

The lower surface nozzle 16 includes a disk portion 16a horizontally held at a height between an upper surface of a spin base 33 and a lower surface of the substrate W, and a tubular portion 16b extending downward from the disk portion 16a along the rotation axis A1. The disk portion 16a has a ring shape surrounding the rotation axis A1 and has an outer diameter smaller than a diameter of the substrate W. An outer diameter of the tubular portion 16b is smaller than the outer diameter of the disk portion 16a. The tubular portion 16b is inserted into a through hole opened in the upper surface center portion of the spin base 33. A discharge port of the lower surface nozzle 16 is opened in the upper surface center portion of the disk portion 16a. The discharge port of the lower surface nozzle 16 faces the lower surface center portion of the substrate W in the up-down direction.

The plurality of nozzles include a solvent nozzle 19 that discharges IPA (liquid) toward the upper surface of the substrate W, and a gas nozzle 22 that discharges gas toward the upper surface of the substrate W. The solvent nozzle 19 is connected to a solvent pipe 20 in which a solvent valve 21 is interposed. IPA (isopropyl alcohol) has a lower boiling point than water, higher volatility than water, and smaller surface tension than water. The gas nozzle 22 is connected to a gas pipe 23 in which a gas valve 24 is interposed. A specific example of the gas discharged from the gas nozzle 22 is nitrogen gas. The gas may be inert gas other than nitrogen gas or may be gas other than inert gas.

The solvent nozzle 19 is connected to a fourth nozzle moving mechanism 25 that moves the solvent nozzle 19 between a processing position and a standby position. The gas nozzle 22 is also connected to the fourth nozzle moving mechanism 25. The gas nozzle 22 may be connected to a fifth nozzle moving mechanism which is different from the fourth nozzle moving mechanism 25. The fourth nozzle moving mechanism 25 raises and lowers the solvent nozzle 19 and the gas nozzle 22 between the processing position where the solvent nozzle 19 and the gas nozzle 22 are close to the upper surface of the substrate W and the standby position above the processing position. The fourth nozzle moving mechanism 25 may be a mechanism that horizontally moves the solvent nozzle 19 and the gas nozzle 22.

The cup 26 includes the plurality of splash guards 28 that receive a liquid discharged outward from the substrate W, and the plurality of annular trays 27 that receive the liquid guided downward by the splash guards 28. The plurality of splash guards 28 surround the spin chuck 31. Each of the splash guards 28 includes a tubular inclination portion 28a extending obliquely upward toward the rotation axis A1, and a cylindrical guide portion 28b extending downward from a lower end portion (outer end portion) of the inclination portion 28a. The inclination portion 28a includes a ring-shaped upper end having a larger inner diameter than the substrate W and the spin base 33. The upper end of the inclination portion 28a corresponds to an upper end of the cup 26. The plurality of guide portions 28b are respectively arranged above the plurality of annular trays 27.

A guard raising/lowering unit (not shown) vertically raises and lowers the splash guards 28 between an upper position where the upper ends of the inclination portions 28a are placed on the upper side of a gripping position where a plurality of chuck members 32 grip the substrate W, and a lower side where the upper ends of the inclination portions 28a are placed on the lower side of the gripping position. When the liquid such as the chemical liquid and the rinse liquid is supplied to the substrate W, the splash guards 28 are arranged at the upper position. The liquid scattered outward from the substrate W is received by the inclination portions 28a and then collected into the annular trays 27 by the guide portions 28b. The controller 3, by controlling the guard raising/lowering unit, causes any of the splash guards 28 selected in accordance with a type of the liquid supplied to the substrate W to face an outer circumferential surface of the substrate W.

Next, the spin chuck 31 will be described.

Figure 2:
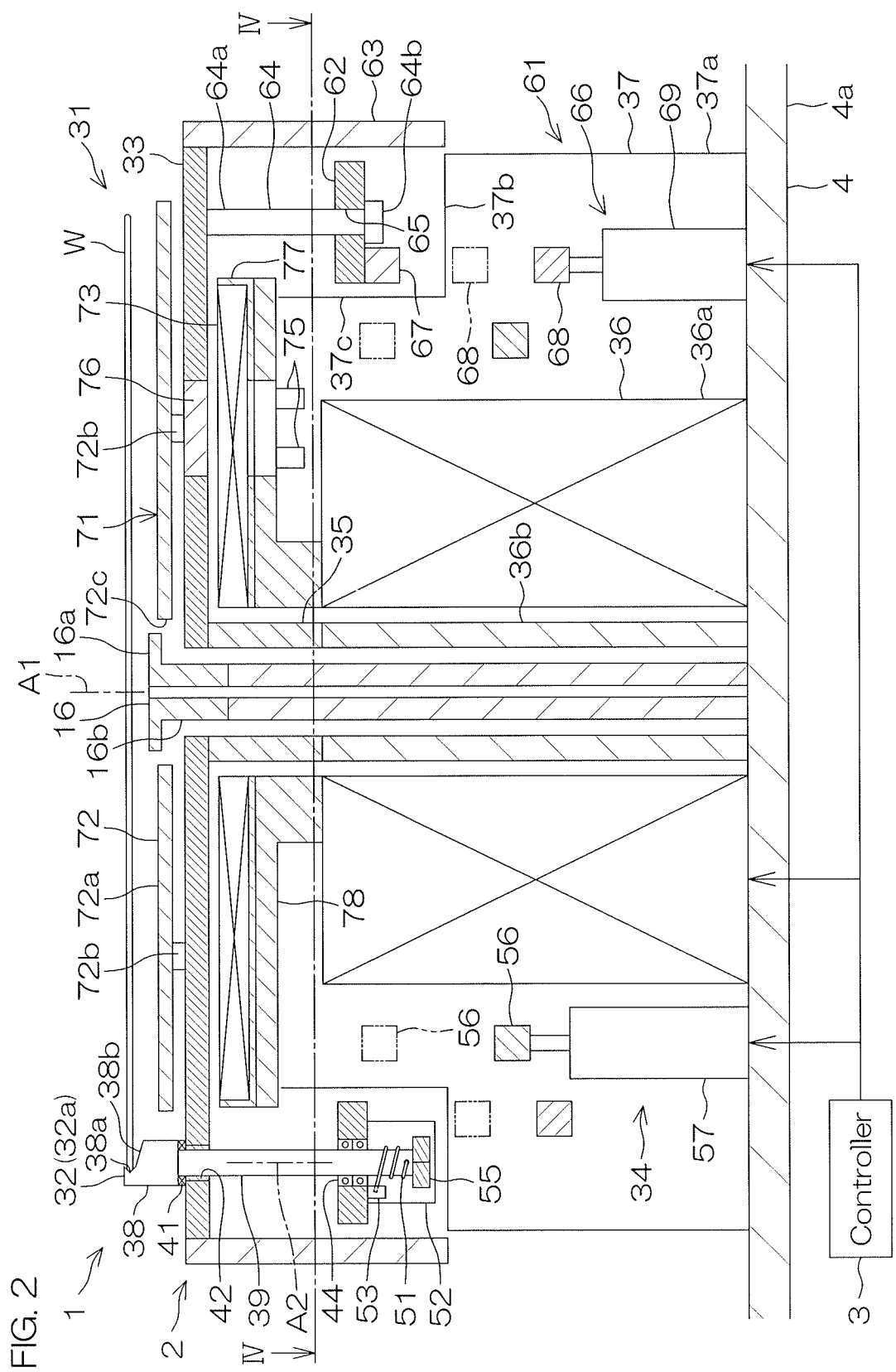
FIG. 2 is a schematic view showing a vertical section of a spin chuck taken along line II-II in FIG. 3.
Figure 3:
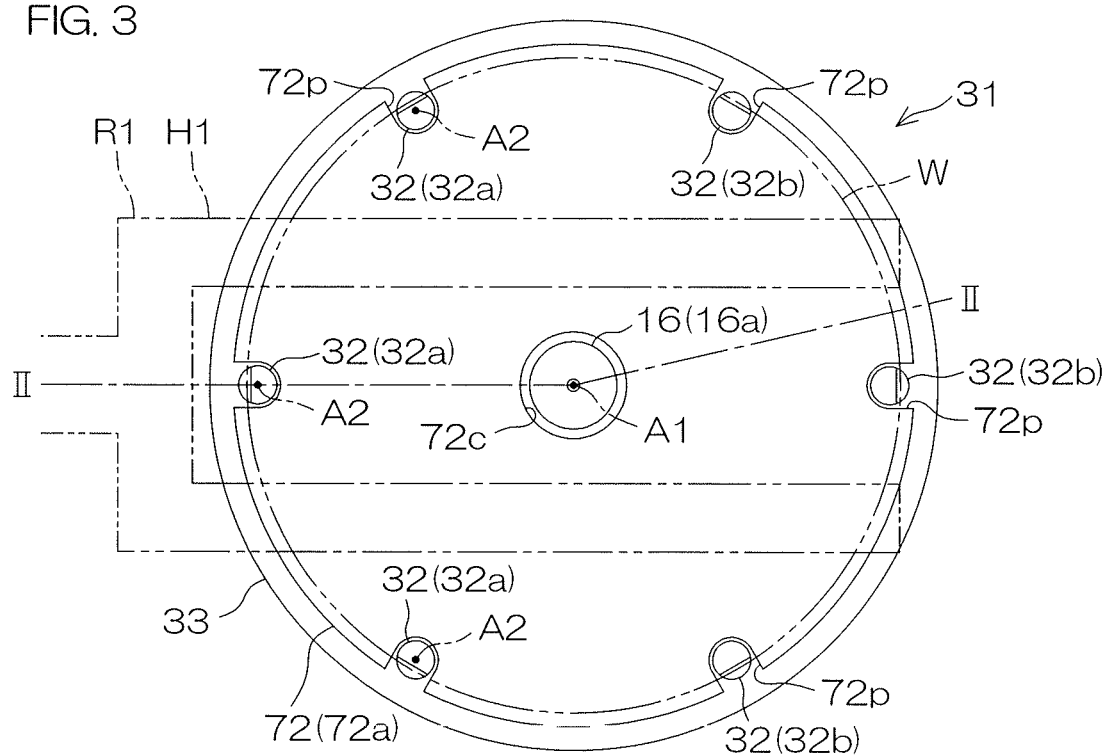
FIG. 3 is a schematic plan view of the spin chuck.
Figure 4:
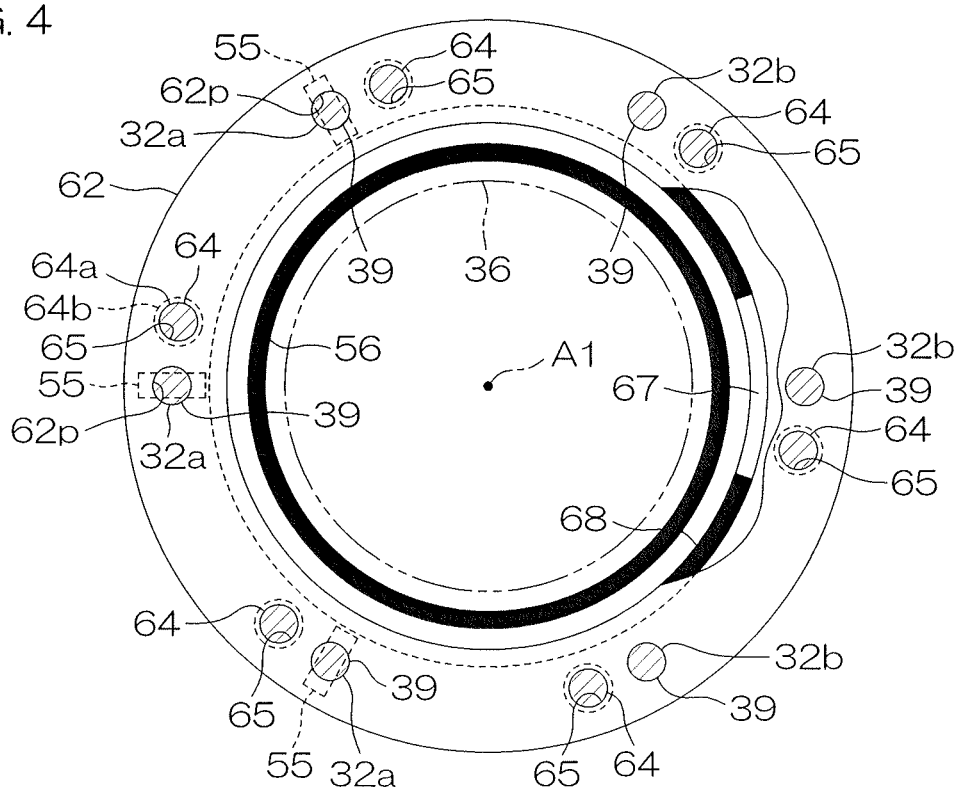
FIG. 4 is a schematic view showing a horizontal section of the spin chuck taken along line IV-IV in FIG. 2.
Figure 5:
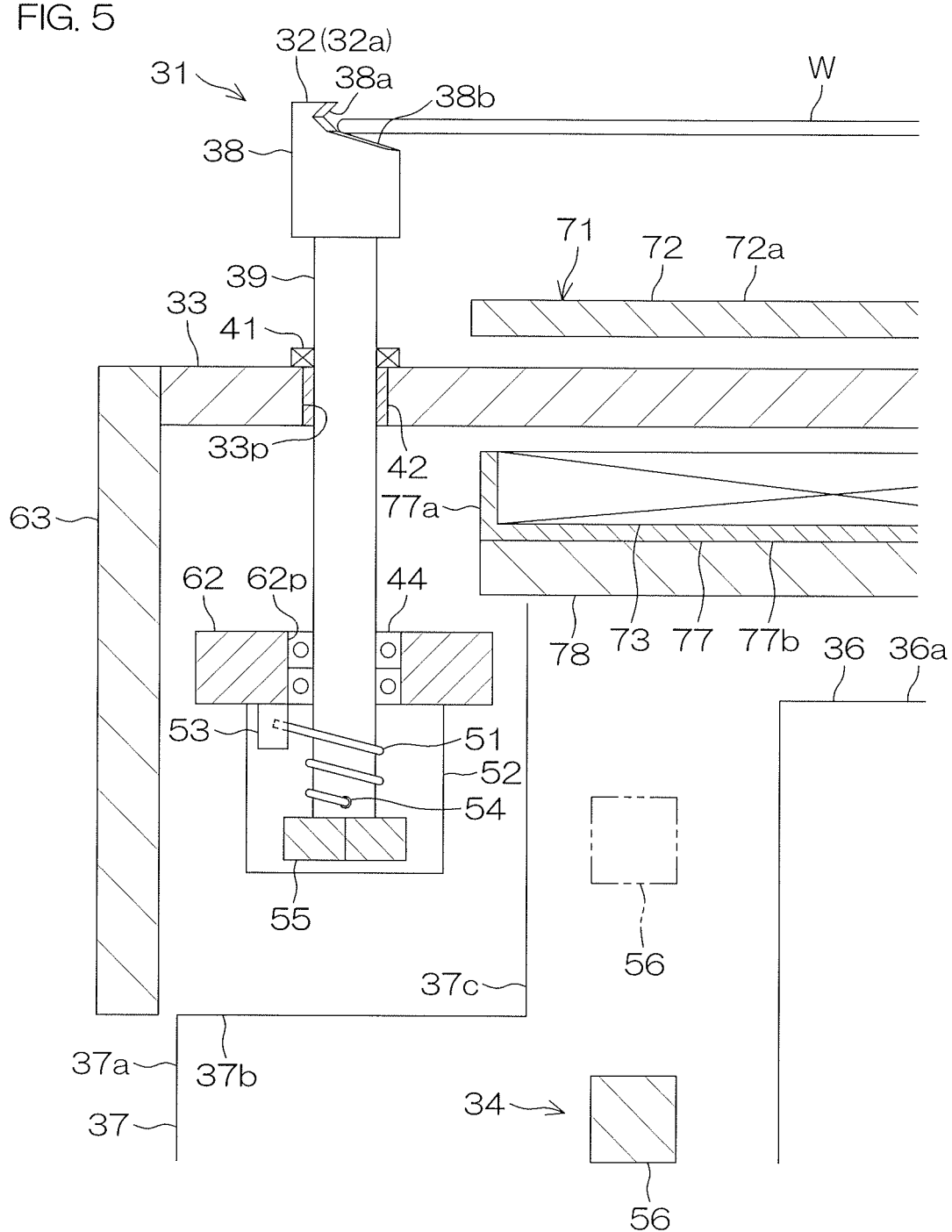
FIG. 5 is a schematic view showing a vertical section for describing a chuck opening/closing mechanism provided in the spin chuck.

FIG. 2 is a schematic view showing a vertical section of the spin chuck 31 taken along line II-II in FIG. 3. FIG. 3 is a schematic plan view of the spin chuck 31. FIG. 4 is a schematic view showing a horizontal section of the spin chuck 31 taken along line IV-IV in FIG. 2. FIG. 5 is a schematic view showing a vertical section for describing a chuck opening/closing mechanism 34 provided in the spin chuck 31. In FIG. 4, exposed portions of a drive magnet 56 and a drive magnet 68 are blackened. FIG. 5 shows a state where a movable chuck 32a is placed at an open position.

As shown in FIG. 2, the spin chuck 31 includes the horizontally-held disk-shaped spin base 33, the plurality of chuck members 32 that horizontally grip the substrate W above the spin base 33, the chuck opening/closing mechanism 34 that opens and closes the plurality of chuck members 32, and a spin motor 36 that rotates the substrate W gripped by the plurality of chuck members 32 by rotating the spin base 33 and the chuck members 32 about the rotation axis A1. The spin base 33 is, for example, a solid disk having an outer diameter larger than the diameter of the substrate W.

The spin motor 36 is a servomotor including a rotor 36b and a stator 36a. The rotor 36b is coupled to the spin base 33 via a spin shaft 35 extending downward from the spin base 33. The stator 36a surrounds the rotor 36b. The rotor 36b and the stator 36a are arranged in a chuck housing 37. The spin motor 36 and the chuck housing 37 are arranged under the spin base 33. The chuck housing 37 includes a tube-shaped lower tubular portion 37a extending upward from a bottom portion 4a of the chamber 4, an annular portion 37b extending inward from an upper end portion of the lower tubular portion 37a, and an upper tubular portion 37c extending upward from an inner end of the annular portion 37b.

The chuck members 32 project upward from the upper surface of the spin base 33. As shown in FIG. 3, the plurality of chuck members 32 are arranged at intervals around the rotation axis A1. The plurality of chuck members 32 include a plurality of movable chucks 32a movable with respect to a raising/lowering member 62 described below, and a plurality of fixed chucks 32b fixed to the raising/lowering member 62. The plurality of movable chucks 32a are placed in the circumferential direction without sandwiching any fixed chucks 32b between the movable chucks 32a. Each of the movable chucks 32a is rotatable about a vertical chuck turning axis A2 with respect to the spin base 33 and the raising/lowering member 62 between a closed position where the gripping portion 38a is pressed against an outer circumferential portion of the substrate W and the open position where the gripping portion 38a is separated from the outer circumferential portion of the substrate W.

As shown in FIG. 5, the movable chuck 32a includes a chuck head 38 to be brought into contact with the substrate W, and a base shaft 39 extending downward from the chuck head 38. The same applies to the fixed chuck 32b (refer to FIG. 6A). The chuck head 38 and the base shaft 39 may be separate members or may be a single integral member. The chuck head includes a supporting portion 38b that supports the substrate W from the lower side of the substrate W, and the gripping portion 38a to be pressed against the outer circumferential portion of the substrate W. The gripping portion 38a includes two groove inner surfaces defining an inward-opened accommodation groove having a V-shaped section. The supporting portion 38b includes an inclination surface extending obliquely downward from the gripping portion 38a toward the rotation axis A1. The supporting portion 38b and the gripping portion 38a are arranged above the spin base 33. The gripping portion 38a is arranged around the substrate W. The supporting portion 38b is arranged under the substrate W.

The base shaft 39 has a columnar shape extending in the up-down direction. The base shaft 39 is inserted into a through portion 33p passing through the spin base 33 in the up-down direction. An inflow of the liquid to the through portion 33p is prevented by an annular seal 41 that surrounds the chuck member 32. The base shaft 39 is supported by the spin base 33 via a sliding bearing 42 arranged in the through portion 33p. The base shaft 39 of either of the movable chuck 32a and the fixed chuck 32b is movable in the up-down direction with respect to the spin base 33. The base shaft 39 of the fixed chuck 32b is fixed to the raising/lowering member 62. The base shaft 39 of the movable chuck 32a is rotatable about the chuck turning axis A2 with respect to the raising/lowering member 62.

The base shaft 39 of the movable chuck 32a is inserted into a through portion 62p passing through the raising/lowering member 62 in the up-down direction. The base shaft 39 of the movable chuck 32a projects downward from the raising/lowering member 62. The base shaft 39 of the movable chuck 32a is supported by the raising/lowering member 62 via a ball bearing 44 arranged in the through portion 62p. The movable chuck 32a is rotatable about the center line of the base shaft 39 corresponding to the chuck turning axis A2 with respect to the raising/lowering member 62. Force to move the raising/lowering member 62 in the up-down direction is transmitted to the movable chuck 32a via the ball bearing 44. The movable chuck 32a is moved in the up-down direction together with the raising/lowering member 62.

The transfer robot R1 places the substrate W on a hand H1 onto the supporting portions 38b of the chuck members 32 in a state where the movable chucks 32a are placed at the open position. In this state, when the chuck opening/closing mechanism 34 moves the movable chucks 32a to the closed position, the plurality of gripping portions 38a come close to the outer circumferential portion of the substrate W while the plurality of supporting portions 38b bring up the substrate W. Thereby, the supporting portions 38b of all the chuck members 32 are separated from the substrate W, and the gripping portions 38a of all the chuck members 32 are pressed against the outer circumferential portion of the substrate W. In this state, when the chuck opening/closing mechanism 34 moves the movable chucks 32a to the open position, the gripping portions 38a of all the chuck members 32 are separated from the substrate W, and the supporting portions 38b of all the chuck members 32 are brought into contact with the outer circumferential portion of the substrate W.

As shown in FIG. 5, the chuck opening/closing mechanism 34 includes an opening mechanism that moves the plurality of movable chucks 32a to the open position, and a closing mechanism that moves the plurality of movable chucks 32a to the closed position. The closing mechanism includes a plurality of coil springs 51 wound around the plurality of movable chucks 32a, respectively. The opening mechanism includes a plurality of driven magnets 55 fixed to the plurality of movable chucks 32a, respectively, and the drive magnet 56 that moves the plurality of movable chucks 32a to the open position by moving the plurality of driven magnets 55.

Each of the coil springs 51 is wound around the base shaft 39 of the movable chuck 32a. The coil spring 51 is arranged under the raising/lowering member 62. The coil spring 51 is accommodated in a casing 52 attached to the raising/lowering member 62. One end portion of the coil spring 51 is inserted into an insertion hole of a holding portion 53 fixed with respect to the raising/lowering member 62. The other end portion of the coil spring 51 is inserted into a holding hole 54 opened on an outer circumferential surface of the movable chuck 32a. Movement of the one end portion of the coil spring 51 with respect to the raising/lowering member 62 is restricted. Movement of the other end portion of the coil spring 51 with respect to the movable chuck 32a is restricted.

The coil spring 51 holds the movable chuck 32a at an original position. FIG. 5 shows a state where the movable chuck 32a is placed at the open position. The original position, the open position, and the closed position are separate positions whose rotation angles about the chuck turning axis A2 are different. The closed position is a position between the original position and the open position regarding the rotation direction of the movable chuck 32a. When the movable chuck 32a is turned from the original position to the open position, the coil spring 51 is elastically deformed, and a restoring force is generated to return the movable chuck 32a to the original position. Thereby, force to move the movable chuck 32a to the closed position is generated.

The plurality of driven magnets 55 are arranged in the plurality of casings 52, respectively. The drive magnet 56 is arranged in the chuck housing 37. The drive magnet 56 is partitioned from the driven magnets 55 by the casings 52 and the chuck housing 37. The drive magnet 56 is arranged on the inner side of the driven magnets 55. The drive magnet 56 is arranged on the outer side of the spin motor 36. The drive magnet 56 may be arranged directly below the driven magnets 55.

As shown in FIG. 4, the drive magnet 56 is arranged along a circle surrounding the rotation axis A1. The drive magnet 56 faces all of the driven magnets 55 in the radial direction in a plan view. The drive magnet 56 has an annular shape in a plan view. The drive magnet 56 may be a ring continuous over the entire circumference or may include a plurality of magnets arranged on a circle surrounding the rotation axis A1.

As shown in FIG. 2, the opening mechanism of the chuck opening/closing mechanism 34 includes, in addition to the drive magnet 56 and the driven magnets 55, an opening/closing actuator 57 that changes a gap between each of the driven magnets 55 and the drive magnet 56 by moving the drive magnet 56. Strength of magnetic force acting between the driven magnet 55 and the drive magnet 56 is changed in accordance with the gap between the driven magnet 55 and the drive magnet 56.

The opening/closing actuator 57 is arranged in the chuck housing 37. The opening/closing actuator 57 moves the drive magnet 56 in the up-down direction between an upper position (position shown by a two short dashes line in FIG. 2) and a lower position (position shown by a solid line in FIG. 2). The upper position is a position where the magnetic force (attracting force or repulsive force) acting between the drive magnet 56 and the driven magnets 55 is more than the restoring force of the coil springs 51, and the movable chucks 32a are arranged at the open position. The lower position is a position where the magnetic force acting between the drive magnet 56 and the driven magnets 55 is less than the restoring force of the coil springs 51, and the movable chucks 32a are arranged at the closed position.

The opening/closing actuator 57 is an air cylinder. The opening/closing actuator 57 may include an electric motor, and a ball screw and a ball nut that convert rotation of the electric motor into a movement of the drive magnet 56 in the up-down direction in place of the air cylinder. The opening/closing actuator 57 includes a rod extending in the axial direction of the air cylinder, a piston coupled to the rod, and a tubular cylinder tube that surrounds the rod and the piston. The drive magnet 56 is coupled to the rod of the air cylinder. The drive magnet 56 is moved in the up-down direction together with the rod of the air cylinder.

As shown in FIG. 2, the spin chuck 31 includes a gap changing mechanism 61 that changes an up-down direction gap between the substrate W gripped by the plurality of chuck members 32 and a heat generating member 72 described below by raising and lowering the plurality of chuck members 32 with respect to the spin base 33. The gap changing mechanism 61 includes the raising/lowering member 62 that supports the plurality of chuck members 32, a plurality of guide members 64 that guide the raising/lowering member 62 in the up-down direction, and a raising/lowering drive unit 66 that generates motive power to move the raising/lowering member 62 in the up-down direction.

The raising/lowering member 62 has a ring shape surrounding the rotation axis A1. The raising/lowering member 62 surrounds the chuck housing 37. The raising/lowering member 62 is arranged under the spin base 33. The raising/lowering member 62 is surrounded by a tubular skirt 63 fixed to the spin base 33. The raising/lowering member 62 is arranged above the annular portion 37b of the chuck housing. The plurality of chuck members 32 project upward from an upper surface of the raising/lowering member 62. When the raising/lowering member 62 is moved in the up-down direction, all the chuck members 32 are moved in the up-down direction together with the raising/lowering member 62.

As shown in FIG. 4, the plurality of guide members 64 are placed at intervals in the circumferential direction. Each of the guide members 64 includes a guide shaft 64a extending in the up-down direction, and a guide stopper 64b larger than the guide shaft 64a in a plan view. The guide shaft 64a is inserted into a through hole 65 passing through the raising/lowering member 62 in the up-down direction. The guide stopper 64b is arranged under the raising/lowering member 62. The guide stopper 64b is larger than the through hole 65 of the raising/lowering member 62 in a plan view.

As shown in FIG. 2, the guide shaft 64a extends downward from the spin base 33. The guide shaft 64a is fixed to the spin base 33. The guide stopper 64b is fixed to the guide shaft 64a. The raising/lowering member 62 is arranged between the spin base 33 and the guide stopper 64b. The raising/lowering member 62 is movable in the up-down direction with respect to the spin base 33 between a lower position where a lower surface of the raising/lowering member 62 is brought into contact with the guide stopper 64b and an upper position where the raising/lowering member 62 is separated upward from the guide stopper 64b.

The raising/lowering drive unit 66 is, for example, a magnetic force generation unit that raises and lowers the raising/lowering member 62 with magnetic force. The magnetic force generation unit includes a driven magnet 67 fixed to the raising/lowering member 62, the drive magnet 68 that raises the raising/lowering member 62 by raising the driven magnet 67, and a raising/lowering actuator 69 that changes the strength of a magnetic force acting between the driven magnet 67 and the drive magnet 68 by moving the drive magnet 68 in the up-down direction.

The driven magnet 67 is fixed to the raising/lowering member 62. The driven magnet 67 is moved in the up-down direction together with the raising/lowering member 62. The driven magnet 67 is arranged out of the chuck housing 37. The drive magnet 68 and the raising/lowering actuator 69 are arranged in the chuck housing 37. The drive magnet 68 is partitioned from the driven magnet 67 by the chuck housing 37.

The drive magnet 68 is arranged on the outer side of the spin motor 36. The drive magnet 68 is arranged below the driven magnet 67. The drive magnet 68 faces the driven magnet 67 in the up-down direction via the chuck housing 37. The drive magnet 68 overlaps with at least a portion of the driven magnet 67 in a plan view. The drive magnet 68 may not overlap with the driven magnet 67 in a plan view.

As shown in FIG. 4, both the driven magnet 67 and the drive magnet 68 are arranged along a circle surrounding the rotation axis A1. The driven magnet 67 has an arc shape in a plan view. The drive magnet 68 has an annular shape in a plan view. The drive magnet 68 may be a ring continuous over the entire circumference or may include the plurality of magnets arranged on a circle surrounding the rotation axis A1. The drive magnet 68 of the gap changing mechanism 61 and the drive magnet 56 of the chuck opening/closing mechanism 34 are arranged at separate positions between which a distance from the rotation axis A1 is different.

As shown in FIG. 2, the raising/lowering actuator 69 is an air cylinder. The raising/lowering actuator 69 may include an electric motor, and a ball screw and a ball nut that convert rotation of the electric motor into a movement of the drive magnet 68 in the up-down direction in place of the air cylinder. The raising/lowering actuator 69 includes a rod extending in the axial direction of the air cylinder, a piston coupled to the rod, and a tubular cylinder tube that surrounds the rod and the piston. The drive magnet 68 is coupled to the rod of the air cylinder. The drive magnet 68 is moved in the up-down direction together with the rod of the air cylinder.

The raising/lowering actuator 69 moves the drive magnet 68 in the up-down direction between an upper position (position shown by a two short dashes line in FIG. 2) and a lower position (position shown by a solid line in FIG. 2). When the drive magnet 68 is raised to the upper position, the driven magnet 67 is brought up by the magnetic force (reactive force) acting between the driven magnet 67 and the drive magnet 68. Accordingly, the raising/lowering member 62 is raised. When the drive magnet 68 reaches the upper position, the raising/lowering member 62 is arranged at an upper position. When the drive magnet 68 is lowered from the upper position to the lower position, the guide stoppers 64b of the guide members 64 are brought into contact with the raising/lowering member 62, and the raising/lowering member 62 is arranged at a lower position.

All the chuck members 32 are moved between an upper position and a lower position in accordance with raising and lowering of the raising/lowering member 62. The heat generating member 72 described below is arranged under the substrate W supported by the supporting portions 38b of the plurality of chuck members 32. The upper position of the chuck members 32 is a retracted position where the substrate W and the heat generating member 72 are separated from each other. The lower position of the chuck members 32 is a proximate position where the substrate W and the heat generating member 72 are close to each other.

When the plurality of chuck members 32 are placed at the lower position corresponding to the proximate position, a distance D1 (refer to FIG. 7) from an upper surface of the heat generating member 72 to the lower surface of the substrate W gripped by the plurality of chuck members 32 is smaller than a thickness T1 of the hand H1 of the transfer robot R1 that supports the substrate W from the lower side of the substrate. The distance D1 is, for example, 0.1 to 10 mm. Therefore, at this time, the transfer robot R1 is not able to place the substrate W on the plurality of chuck members 32 or not able to take the substrate W from the plurality of chuck members 32.

Figure 6A:
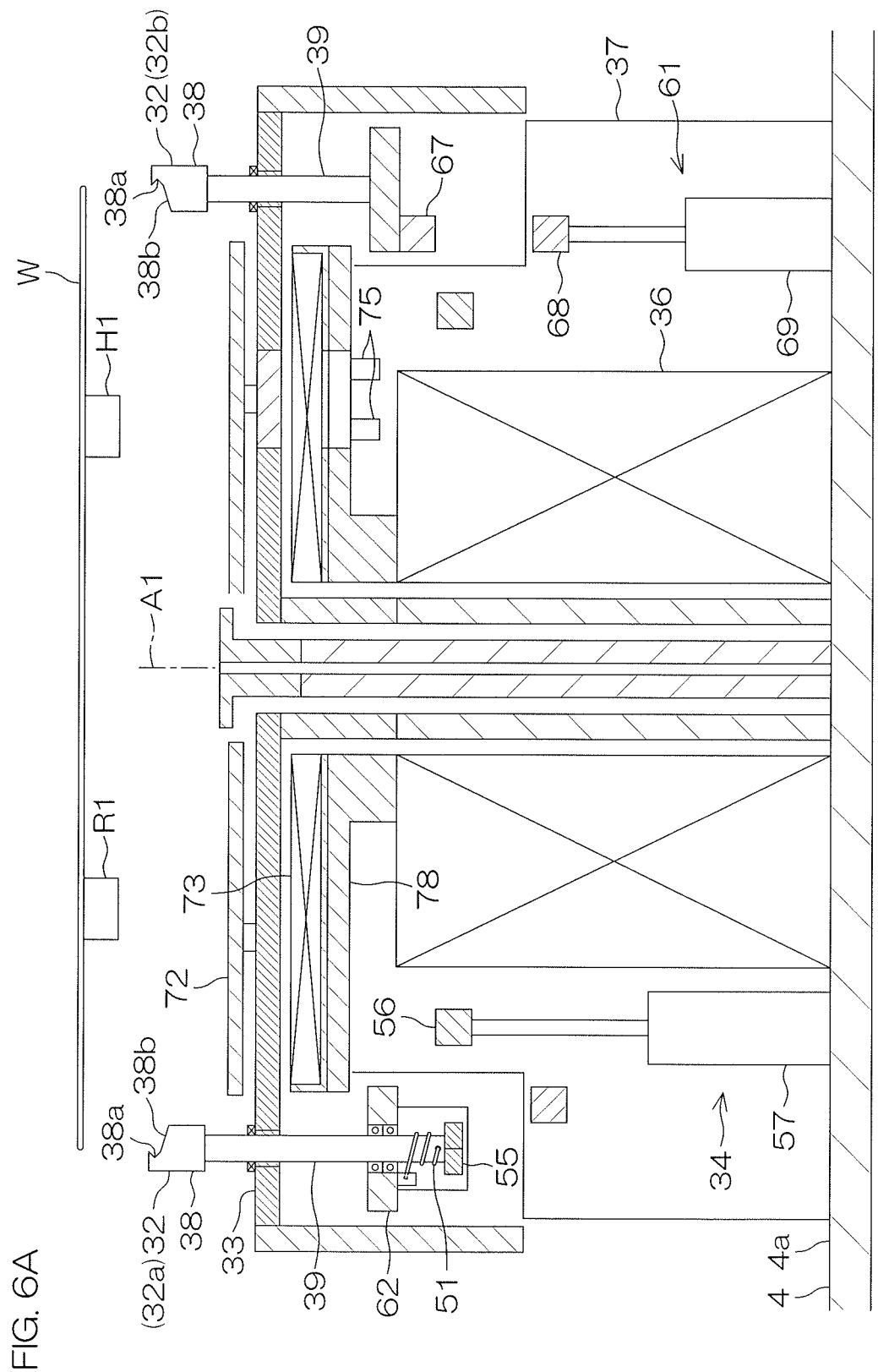
FIG. 6A is a schematic view for describing transfer of a substrate.
Figure 6B:
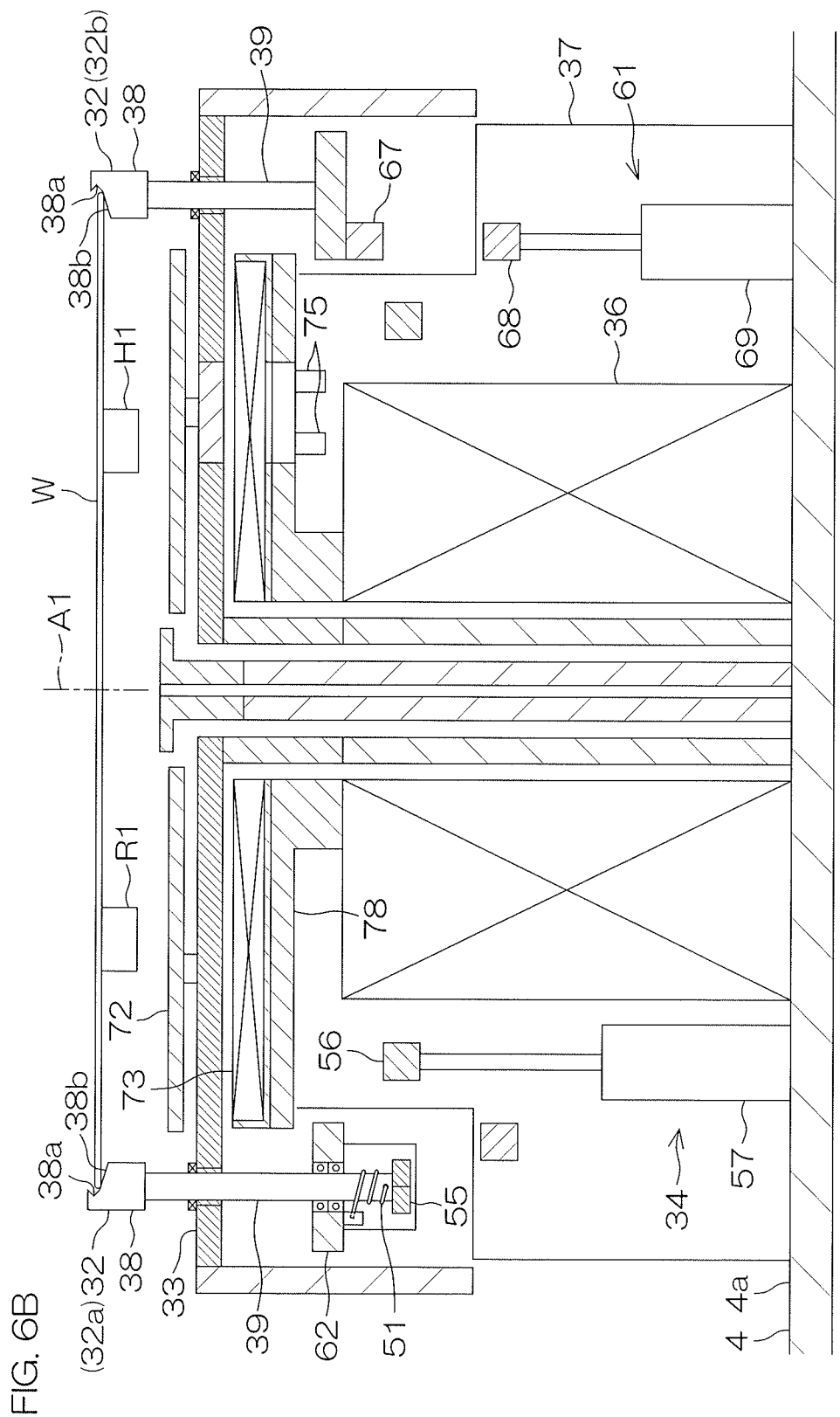
FIG. 6B is a schematic view for describing the transfer of the substrate.

FIGS. 6A to 6B are schematic views for describing transfer of the substrate W between the spin chuck 31 and the transfer robot R1.

When the transfer robot R1 places the substrate W on the plurality of chuck members 32, as shown in FIG. 6A, the raising/lowering actuator 69 places the plurality of chuck members 32 at the upper position, and the opening/closing actuator 57 places the movable chucks 32a at the open position. As shown in FIG. 6B, in this state, the substrate W supported by the hand H1 is placed on the supporting portions 38b of the plurality of chuck members 32. After that, the transfer robot R1 moves the hand H1 downward by a movement amount with which the hand H1 is not brought into contact with the heat generating member 72. Thereby, the hand H1 is separated from the substrate W. Subsequently, the transfer robot R1 retracts the hand H1 from a space between the substrate W and the heat generating member 72.

The opening/closing actuator 57 moves the movable chucks 32a toward the original position after the hand H1 of the transfer robot R1 is retracted from the lower side of the substrate W. At this time, the movable chucks 32a do not reach the original position but stop by at the closed position before the original position. Thereby, the gripping portions 38a of the movable chucks 32a are pressed against the outer circumferential portion of the substrate W by the restoring force of the coil springs 51. Accordingly, the gripping portions 38a of the fixed chucks 32b are also pressed against the outer circumferential portion of the substrate W. Thereby, the substrate W is gripped by the plurality of chuck members 32.

When the transfer robot R1 takes the substrate W from the plurality of chuck members 32, the raising/lowering actuator 69 moves the plurality of chuck members 32 to the upper position. After that, the opening/closing actuator 57 moves the movable chucks 32a to the open position. Thereby, as shown in FIG. 6B, the gripping portions 38a of all the chuck members 32 are separated from the outer circumferential portion of the substrate W, and the supporting portions 38b of all the chuck members 32 are brought into contact with the outer circumferential portion of the substrate W. In this state, the transfer robot R1 inserts the hand H1 between the substrate W and the heat generating member 72 and moves the hand H1 upward. As shown in FIG. 6A, in this process, the substrate W is separated from the supporting portions 38b of all the chuck members 32 and supported by the hand H1 of the transfer robot R1.

Next, an IH heating mechanism 71 that heats the substrate W from the lower side will be described.

Figure 7:
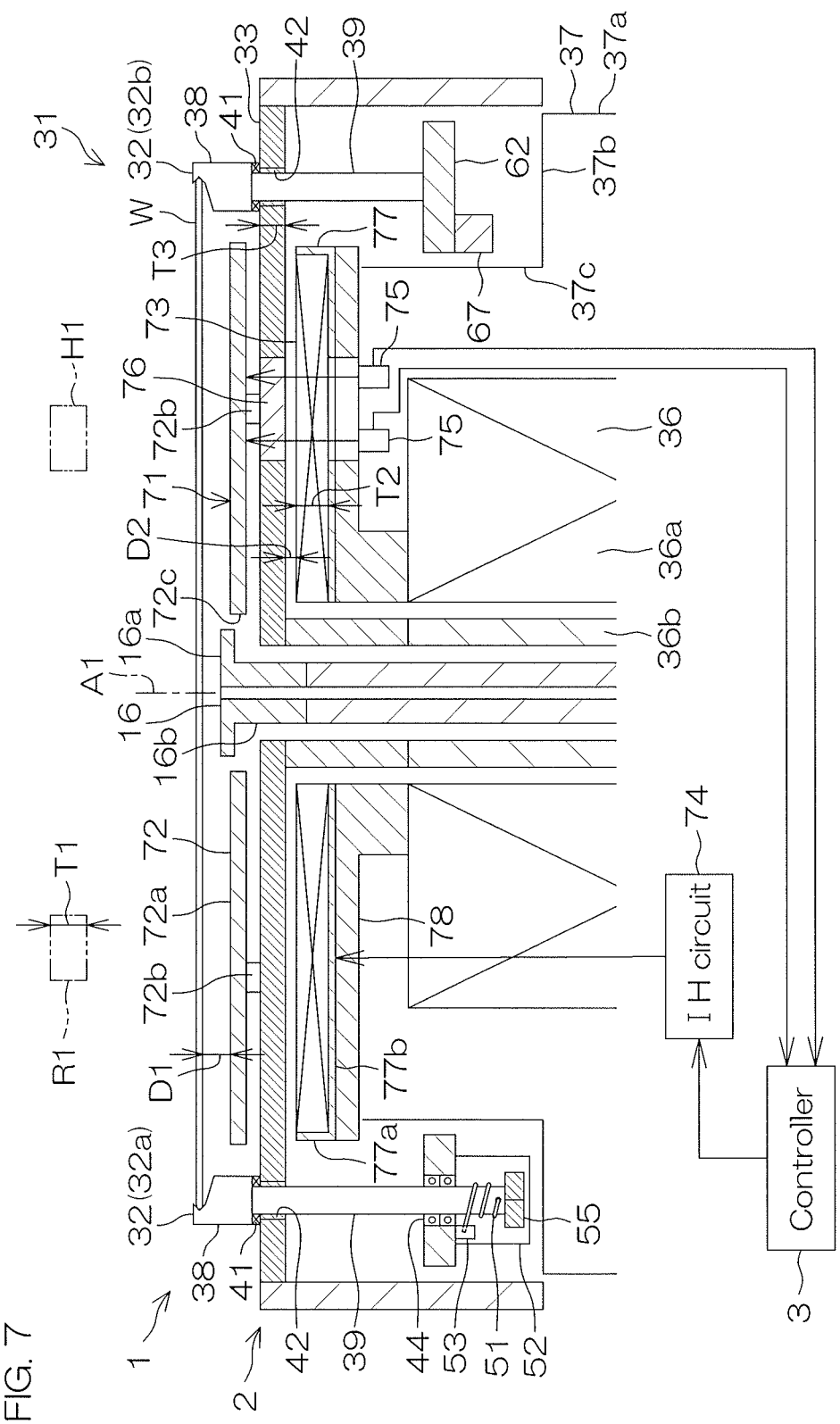
FIG. 7 is a schematic view showing a vertical section for describing an IH heating mechanism provided in the spin chuck.
Figure 8:
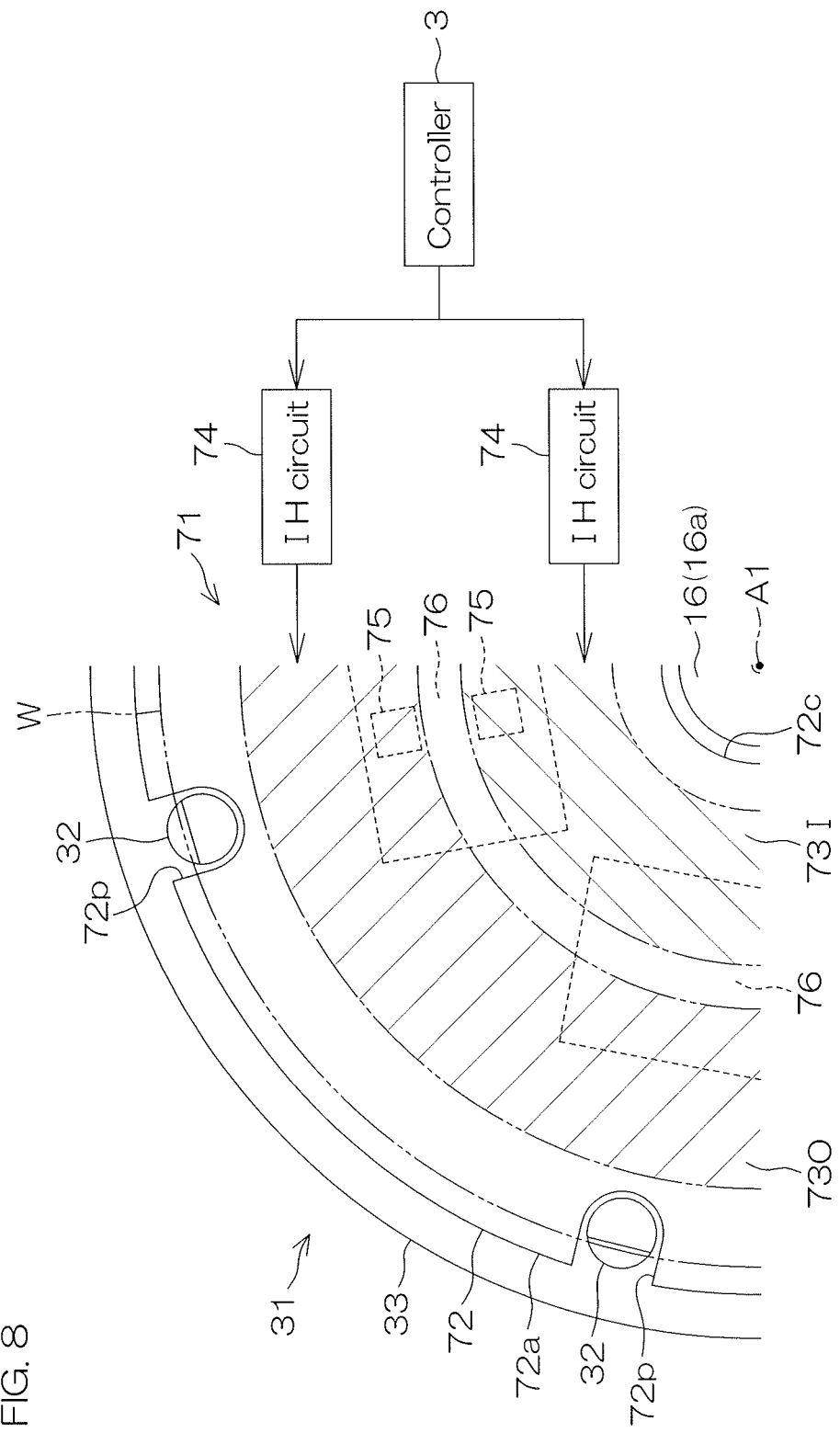
FIG. 8 is a schematic plan view for describing an arrangement of a heating coil.

FIG. 7 is a schematic view showing a vertical section for describing the IH heating mechanism 71 provided in the spin chuck 31. FIG. 8 is a schematic plan view for describing an arrangement of a heating coil 73.

As shown in FIG. 7, the spin chuck 31 includes the IH heating mechanism 71 that heats the substrate W held by the plurality of chuck members 32. The IH heating mechanism 71 includes the heat generating member 72 that heats the substrate W, the heating coil 73 to which electric power is supplied, and an IH circuit 74 that causes the heating coil 73 to generate an alternating magnetic field to be applied to the heat generating member 72 by supplying the electric power to the heating coil 73 so that the heat generating member 72 generates heat. The IH heating mechanism 71 further includes a magnetic shielding member 77 that protects the members other than the heat generating member 72 from the alternating magnetic field, and a supporting member 78 that supports the heating coil 73.

The heat generating member 72 is a conductive body that generates Joule heat in accordance with generation of eddy current due to the alternating magnetic field. The heat generating member 72 is also called a susceptor. At least the surface of the heat generating member 72 is made of a material having chemical resistance. Similarly, at least the surface of the spin base 33 is made of a material having chemical resistance. That is, all the parts to be brought into contact with the chemical liquid are made of a material having chemical resistance. The same applies to the members other than the heat generating member 72 and the spin base 33 such as the chuck members 32.

The heat generating member 72 may be an integrated body of a plurality of members, or may be a single integral member. For example, the heat generating member 72 may include a carbon core member and a silicon carbide (SiC) coating layer that covers the surface of the core member, or may be made of glassy carbon. The heat generating member 72 may be made of a material other than these such as metal. In order to prevent the influence of the alternating magnetic field on a device formed on the front surface of the substrate W, at least a portion of the heat generating member 72 may be made of a soft magnetic material that shields a magnetic field such as iron.

The heat generating member 72 includes a plate-shaped portion 72a arranged between the substrate W and the spin base 33. The plate-shaped portion 72a has, for example, a ring shape surrounding the rotation axis A1. A thickness (up-down direction length) of the plate-shaped portion 72a is smaller than a thickness T3 of the spin base 33. An upper surface and a lower surface of the plate-shaped portion 72a are parallel to the upper surface and the lower surface of the substrate W. The lower surface of the plate-shaped portion 72a faces the upper surface of the spin base 33 in parallel via a space. A distance from the upper surface of the spin base 33 to the lower surface of the plate-shaped portion 72a may be equal to the distance D1 from the upper surface of the plate-shaped portion 72a to the lower surface of the substrate W, or may be longer or shorter than the distance D1.

When the plurality of chuck members 32 grip the substrate W and are placed at the lower position, the upper surface of the plate-shaped portion 72a is close to the lower surface of the substrate W. At this time, the up-down direction distance D1 from the upper surface of the plate-shaped portion 72a to the lower surface of the substrate W is shorter than the thickness T1 of the hand H1 of the transfer robot R1. Meanwhile, when the plurality of chuck members 32 grip the substrate W and are placed at the upper position, the up-down direction distance D1 from the upper surface of the plate-shaped portion 72a to the lower surface of the substrate W is longer than the thickness T1 of the hand H1 of the transfer robot R1. Therefore, as long as the plurality of chuck members 32 are placed at the upper position, the transfer robot R1 is able to place the substrate W on the plurality of chuck members 32 or take the substrate W from the plurality of chuck members 32.

The heat generating member 72 includes a plurality of leg portions 72b extending downward from the plate-shaped portion 72a. The leg portions 72b may be a portion of the spin base 33. That is, the spin base 33 may include a disk portion having an outer diameter larger than the diameter of the substrate W, and the plurality of leg portions 72b extending upward from a horizontal upper surface of the disk portion. The leg portions 72b extend from the lower surface of the plate-shaped portion 72a to the upper surface of the spin base 33. The plate-shaped portion 72a is supported by the plurality of leg portions 72b. The heat generating member 72 is fixed to the spin base 33. The heat generating member 72 is rotated about the rotation axis A1 together with the spin base 33.

As shown in FIG. 3, the plurality of chuck members 32 are inserted into the plurality of through portions 72p of the heat generating member 72, respectively. The through portions 72p pass through an outer circumferential portion of the heat generating member 72 in the up-down direction. The through portions 72p may be notches opened on an outer circumferential surface of the plate-shaped portion 72a, or may be through holes whose entire circumference is closed. The outer circumferential surface of the plate-shaped portion 72a is placed on the outer side of inner ends of the chuck members 32. An outer diameter of the plate-shaped portion 72a, that is, an outer diameter of the heat generating member 72 is smaller than the outer diameter of the spin base 33 and larger than an outer diameter of the substrate W. The outer diameter of the heat generating member 72 may be equal to the outer diameter of the substrate W or may be smaller than the outer diameter of the substrate W.

As shown in FIG. 7, the heating coil 73 is arranged between the supporting member 78 and the spin base 33. The heating coil 73 is separated downward from a lower surface of the spin base 33. The heating coil 73 is arranged to overlap with the heat generating member 72 in a plan view. The heating coil 73 is separated from the heat generating member 72 and not physically connected to the heat generating member 72. The heating coil 73 surrounds the spin shaft 35 while being spaced from the spin shaft in the radial direction. The plurality of chuck members 32 are arranged around the heating coil 73. The heating coil 73 is separated from the chuck members 32 in the radial direction. An outer end of the heating coil 73 is arranged on the outer side of an outer circumferential surface of the spin motor 36.

As shown in FIG. 8, the heating coil 73 is arranged in an annular region surrounding the rotation axis A1. FIG. 8 shows an example in which two heating coils 73 independent of each other are respectively arranged in two annular regions. The two heating coils 73 include an inner coil 73I arranged in an inner side annular region RI which surrounds the rotation axis A1, and an outer coil 73O arranged in an outer side annular region RO which surrounds the inner side annular region RI in a concentric manner. The two heating coils 73 are connected to two IH circuits 74, respectively. Frequencies of alternating current flowing through the two heating coils 73 are individually changed by the two IH circuits 74.

The heat generating member 72 is arranged in the alternating magnetic field generated in the vicinity of the heating coil 73. The frequency of the alternating current flowing through the heating coil 73 is changed by the IH circuit 74. A temperature of the heat generating member 72 is changed by the frequency of the alternating current flowing through the heating coil 73. The IH circuit 74 is controlled by the controller 3. Since the two heating coils 73 independent of each other are provided, the controller 3 is able to cause the heat generating member 72 to generate heat so that the temperature of the heat generating member 72 becomes uniform, or to cause the heat generating member 72 to generate heat so that the heat generating member 72 has a temperature gradient in the radial direction.

The temperature of the heat generating member 72 is detected by a thermometer 75. FIG. 8 shows an example in which two thermometers 75 are provided and detect the temperature of the heat generating member 72 at two positions different from each other in a distance from the rotation axis A1. The number of thermometer 75 may be one or may be three or more. A detection value of thermometer 75 is input to the controller 3. The controller 3 brings the temperature of the heat generating member 72 close to a target temperature by controlling the IH circuit 74 based on the detection value of thermometer 75. Thereby, the heat generating member 72 is maintained at the target temperature with a high degree of accuracy.

As shown in FIG. 7, thermometer 75 is arranged under the heating coil 73. Thermometer 75 faces the spin base 33 via the clearance of the heating coil 73. Thermometer 75 is a radiation thermometer that detects a temperature of an object by detecting intensity of an infrared ray or a visible light emitted from the object. Thermometer 75 is a non-contact thermometer that detects the temperature of the heat generating member 72 in a non-contact manner with the heat generating member 72. Thermometer 75 detects the temperature of the heat generating member 72 via a plurality of detection windows of the spin base 33 closed by a plurality of transparent members 76. The detection windows pass through the spin base 33 in the up-down direction. The transparent members 76 are made of a transparent material where light including an infrared ray penetrates.

Thermometers 75 are supported by the supporting member 78. Even when the heat generating member 72 is rotated together with the spin base 33, thermometers 75 are not rotated. Meanwhile, when the spin base 33 is rotated, the plurality of detection windows provided in the spin base 33 are also rotated. As shown in FIG. 8, the plurality of detection windows of the spin base 33 are arranged in the circumferential direction on a circle surrounding the rotation axis A1. Therefore, almost all the time when the spin base 33 is rotated, any of the plurality of detection windows faces thermometers 75. Thus, thermometers 75 can detect the temperature of the heat generating member 72 even when the spin base 33 is rotated.

As shown in FIG. 7, the magnetic shielding member 77 includes a tubular outer wall portion 77a that surrounds the heating coil 73, and a lower wall portion 77b located under the heating coil 73. The magnetic shielding member 77 is made of a soft magnetic material such as iron. The lower wall portion 77b is placed between the heating coil 73 and the supporting member 78 in the up-down direction. The lower wall portion 77b has a ring shape surrounding the rotation axis A1. The outer wall portion 77a extends upward from an outer circumferential portion of the lower wall portion 77b. The outer wall portion 77a is placed between the heating coil 73 and the chuck members 32 in the radial direction. The members placed in the vicinity of the heating coil 73 such as the chuck members 32 are shielded from the alternating magnetic field by the magnetic shielding member 77.

The supporting member 78 is fixed with respect to the bottom portion 4a of the chamber 4. FIG. 7 shows an example in which the supporting member 78 is supported on the stator 36a of the spin motor 36. The supporting member 78 is arranged on the upper side of the spin motor 36. The supporting member 78 has a ring shape surrounding the rotation axis A1. An outer diameter of the supporting member 78 is larger than an outer diameter of the spin motor 36. An outer circumferential portion of the supporting member 78 is placed above the upper tubular portion 37c of the chuck housing 37. The spin shaft 35 is inserted into a through hole passing through the center portion of the supporting member 78 in the up-down direction. The supporting member 78 surrounds the spin shaft 35 while being spaced from the spin shaft in the radial direction.

When the controller 3 starts supply of electric power to the heating coil 73, the alternating magnetic field is generated in the vicinity of the heating coil 73, and the heat generating member 72 generates heat. Accordingly, the temperature of the heat generating member 72 is rapidly increased and maintained at the target temperature of the heat generating member 72 or close to the target temperature. Thereby, a temperature of the substrate W is rapidly increased and maintained at a target temperature of the substrate W or close to the target temperature. Rotation of the spin motor 36 is transmitted to the heat generating member 72 via the spin shaft 35 and the spin base 33. Therefore, when the spin motor 36 is rotated while the controller 3 causes the heat generating member 72 to generate heat, the heat generating member 72 is rotated together with the substrate W while heating the substrate W.

As described above, the thickness T1 of the plate-shaped portion 72a of the heat generating member 72 is smaller than the thickness T3 of the spin base 33. In such a way, since the heat generating member 72 is thin, it is possible to reduce the volume of the heat generating member 72, and to reduce heat capacity of the heat generating member 72. Thereby, it is possible to cause the heat generating member 72 to immediately reach the target temperature. Further, in a case where at least a portion of the heat generating member 72 is made of a material having large thermal conductivity such as carbon, it is possible to further shorten the time required for the heat generating member 72 to reach the target temperature. In addition, it is also possible to reduce unevenness of the temperature of the heat generating member 72.

Next, an example of processing of the substrate W to be executed by the substrate processing apparatus 1 will be described.

Figure 9:
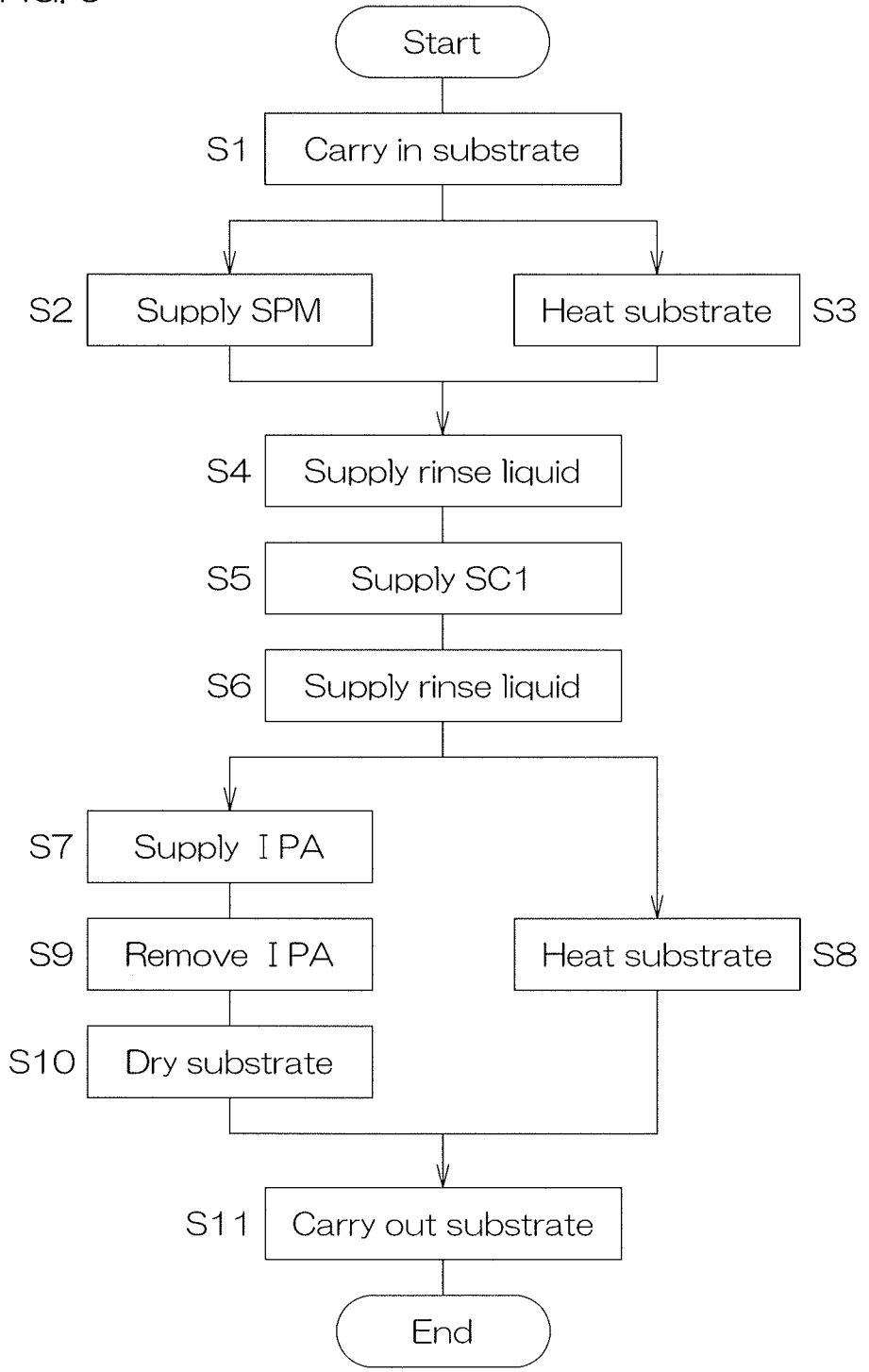
FIG. 9 is a flowchart for describing an example of processing of the substrate to be executed by the substrate processing apparatus.

FIG. 9 is a flowchart for describing the example of the processing of the substrate W to be executed by the substrate processing apparatus 1. FIGS. 10A to 10F are schematic views showing states of the substrate W when steps included in the example of the processing of the substrate W shown in FIG. 9 are being executed. The following steps are executed by the controller 3 controlling the substrate processing apparatus 1. In other words, the controller 3 is programmed so as to execute the following steps.

When the substrate W is processed in the substrate processing apparatus 1, a carry-in step of carrying the substrate W into the chamber 4 is performed (Step S1 of FIG. 9).

Specifically, before the substrate W is carried into the chamber 4, all the splash guards 28 are arranged at the lower position, and all the movable nozzles including the first chemical liquid nozzle 5 are arranged at the standby position. Further, all the chuck members 32 are arranged at the upper position, and all the movable chucks 32a are arranged at the open position. In this state, the transfer robot R1 causes the hand H1 to enter into the chamber 4, and places the substrate W on the hand H1 onto the plurality of chuck members 32. Thereby, the substrate W is carried into the chamber 4 and supported by the supporting portions 38b of the plurality of chuck members 32.

After that, the transfer robot R1 retracts the hand H1 from the inside of the chamber 4. The opening/closing actuator 57 moves all the movable chucks 32a to the closed position. Thereby, the substrate W is separated from the supporting portions 38b of the plurality of chuck members 32 and gripped by the gripping portions 38a of the plurality of chuck members 32. After that, the raising/lowering actuator 69 moves all the chuck members 32 to the lower position. Subsequently, the spin motor 36 starts rotation. The rotation of the spin motor 36 is transmitted to the substrate W via the spin base 33 and the chuck members 32. Thereby, the substrate W is rotated about the rotation axis A1.

Next, as shown in FIG. 10A, a first chemical liquid supply step (Step S2 of FIG. 9) of supplying SPM serving as an example of the chemical liquid to the upper surface of the substrate W, and a first heating step (Step S3 of FIG. 9) of heating the substrate W and SPM on the substrate W are performed in parallel.

Regarding the first chemical liquid supply step, the first nozzle moving mechanism 8 moves the first chemical liquid nozzle 5 from the standby position to the processing position, and the guard raising/lowering unit causes any of the splash guards 28 to face the outer circumferential portion of the substrate W. After that, the first chemical liquid valve 7 is opened, and the first chemical liquid nozzle 5 starts discharge of SPM. The first chemical liquid nozzle 5 discharges SPM at a temperature (for example, 140° C.) higher than a room temperature toward the upper surface of the rotating substrate W. In this state, the first nozzle moving mechanism 8 moves a liquid landing position of SPM on the upper surface of the substrate W between the center portion and the outer circumferential portion by moving the first chemical liquid nozzle 5. When a predetermined time passes after opening of the first chemical liquid valve 7, the first chemical liquid valve 7 is closed and the discharge of SPM is stopped. After that, the first nozzle moving mechanism 8 retracts the first chemical liquid nozzle 5 to the standby position.

The SPM discharged from the first chemical liquid nozzle 5 lands on the upper surface of the substrate W and then flows outward along the upper surface of the substrate W due to centrifugal force. Therefore, SPM is supplied over the entire upper surface of the substrate W and a liquid film of SPM covering the entire upper surface of the substrate W is formed on the substrate W. Thereby, foreign substances such as a resist film are removed from the substrate W by SPM. Further, the first nozzle moving mechanism 8 moves the liquid landing position of SPM on the upper surface of the substrate W between the center portion and the outer circumferential portion in a state where the substrate W is rotating. Thus, the liquid landing position of SPM passes through the entire upper surface of the substrate W and the entire upper surface of the substrate W is scanned. Therefore, SPM is directly sprayed over the entire upper surface of the substrate W, and the entire upper surface of the substrate W is uniformly processed.

Regarding the first heating step, the controller 3 starts the supply of electric power to the heating coil 73. As long as the substrate W and SPM on the substrate W are heated by the heat generating member 72, the supply of electric power may be started at the same time as the opening of the first chemical liquid valve 7 or may be started before or after the first chemical liquid valve 7 is opened. When the supply of electric power to the heating coil 73 is started, the alternating magnetic field is generated in the vicinity of the heating coil 73, and the heat generating member 72 generates heat. When a predetermined time passes after the start of the supply of electric power, the supply of electric power to the heating coil 73 is stopped. The supply of electric power may be stopped at the same time as closing of the first chemical liquid valve 7 or may be stopped before or after the first chemical liquid valve 7 is closed.

When the supply of electric power to the heating coil 73 is started, the heat generating member 72 immediately reaches a predetermined high temperature. The heat generating member 72 is maintained at, for example, a high temperature higher than the boiling point of the first chemical liquid (SPM). The upper surface of the heat generating member 72 is separated downward from the lower surface of the substrate W but is close to the lower surface of the substrate W so that the hand H1 of the transfer robot R1 is not able to enter between the substrate W and the heat generating member 72. Further, the entire region of the substrate W or the substantially entire region of the substrate W overlaps with the heat generating member 72 in a plan view. Therefore, the substrate W and SPM on the substrate W are uniformly heated and a processing ability of SPM is enhanced. Thereby, the substrate W is efficiently processed by SPM.

Next, as shown in FIG. 10B, a first rinse liquid supply step (Step S4 of FIG. 9) of supplying pure water serving as an example of the rinse liquid to both the upper surface and the lower surface of the substrate W is performed.

Specifically, the first rinse liquid valve 15 is opened, and the rinse liquid nozzle 13 starts discharge of pure water. Thereby, pure water is discharged from the rinse liquid nozzle 13 toward the upper surface center portion of the rotating substrate W. Pure water landing on the upper surface of the substrate W flows outward along the upper surface of the substrate W. SPM on the substrate W is washed away by the pure water discharged from the rinse liquid nozzle 13. Thereby, a liquid film of pure water covering the entire upper surface of the substrate W is formed. When a predetermined time passes after opening of the first rinse liquid valve 15, the first rinse liquid valve 15 is closed and the discharge of pure water is stopped.

Meanwhile, the second rinse liquid valve 18 is opened, and the lower surface nozzle 16 starts discharge of pure water. Thereby, pure water is discharged from the lower surface nozzle 16 toward the lower surface center portion of the rotating substrate W. The second rinse liquid valve 18 may be opened at the same time as the first rinse liquid valve 15 or may be opened before or after the first rinse liquid valve 15 is opened. Pure water landing on the lower surface of the substrate W flows outward along the lower surface of the substrate W. A mist, etc., of the SPM adhered to the lower surface of the substrate W is washed away by the pure water discharged from the lower surface nozzle 16. When a predetermined time passes after opening of the second rinse liquid valve 18, the second rinse liquid valve 18 is closed and the discharge of pure water is stopped.

Figure 10C:
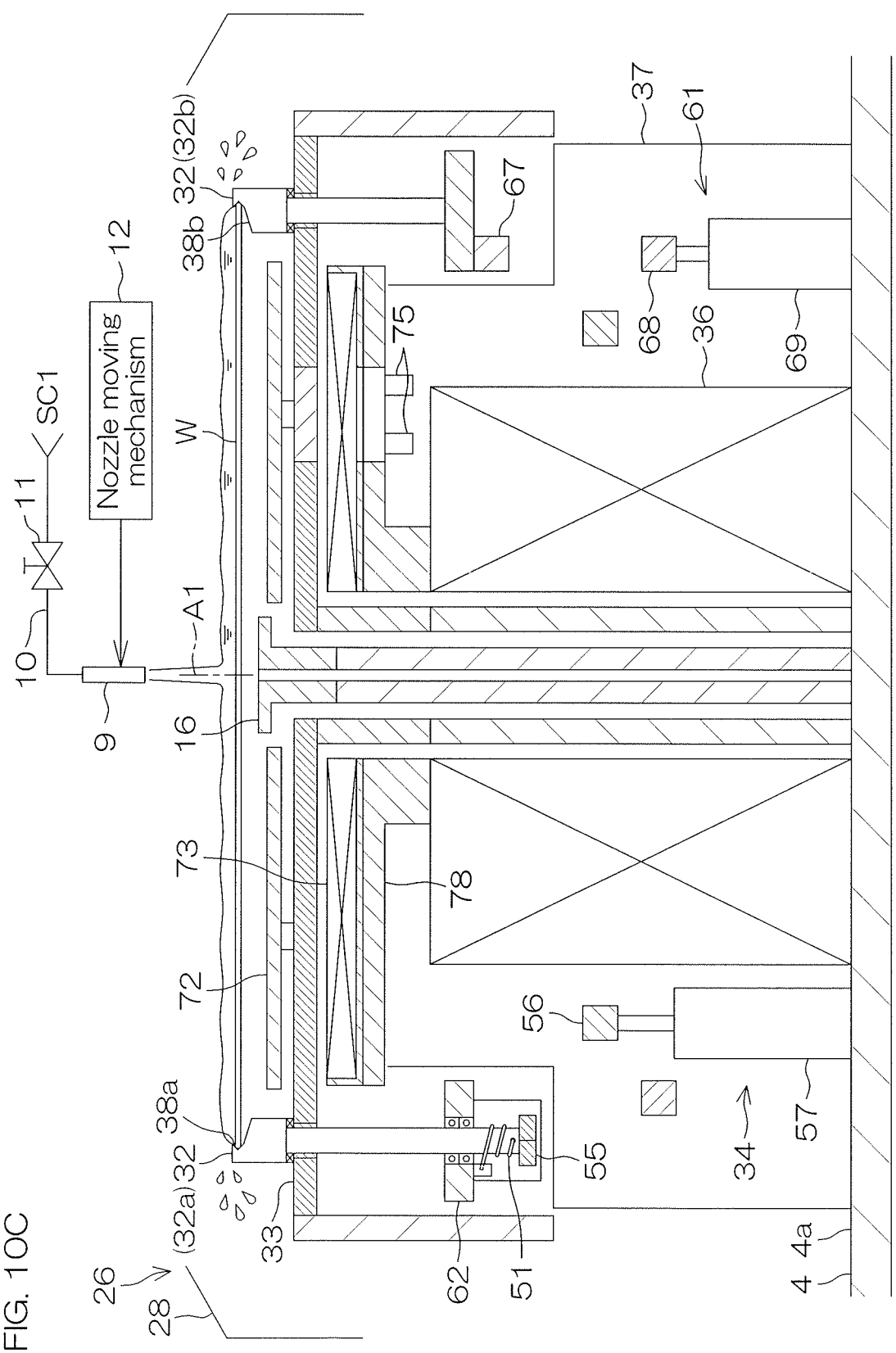
FIG. 10C is a schematic view showing a state where SC1 is supplied to the substrate in the example of the processing of the substrate shown in FIG. 9.

Next, as shown in FIG. 10C, a second chemical liquid supply step (Step S5 of FIG. 9) of supplying SC1 serving as an example of the chemical liquid to the upper surface of the substrate W is performed.

Specifically, the second nozzle moving mechanism 12 moves the second chemical liquid nozzle 9 from the standby position to the processing position, and the guard raising/lowering unit causes the splash guard 28 which is different from that in the first chemical liquid supply step to face the outer circumferential portion of the substrate W. After that, the second chemical liquid valve 11 is opened, and the second chemical liquid nozzle 9 starts discharge of SC1. In this state, the second nozzle moving mechanism 12 moves a liquid landing position of SC1 on the upper surface of the substrate W between the center portion and the outer circumferential portion by moving the second chemical liquid nozzle 9. When a predetermined time passes after opening of the second chemical liquid valve 11, the second chemical liquid valve 11 is closed and the discharge of SC1 is stopped. After that, the second nozzle moving mechanism 12 retracts the second chemical liquid nozzle 9 to the standby position.

The SC1 discharged from the second chemical liquid nozzle 9 lands on the upper surface of the substrate W and then flows outward along the upper surface of the substrate W due to centrifugal force. Therefore, SC1 is supplied over the entire upper surface of the substrate W and a liquid film of SC1 covering the entire upper surface of the substrate W is formed on the substrate W. Thereby, foreign substances such as particles are removed from the substrate W by SC1. Further, the second nozzle moving mechanism 12 moves the liquid landing position of SC1 on the upper surface of the substrate W between the center portion and the outer circumferential portion in a state where the substrate W is rotating. Thus, the liquid landing position of SC1 passes through the entire upper surface of the substrate W and the entire upper surface of the substrate W is scanned. Therefore, SC1 is directly sprayed over the entire upper surface of the substrate W, and the entire upper surface of the substrate W is uniformly processed.

Next, as shown in FIG. 10B, a second rinse liquid supply step (Step S6 of FIG. 9) of supplying pure water serving as an example of the rinse liquid to both the upper surface and the lower surface of the substrate W is performed.

Specifically, the first rinse liquid valve 15 is opened, and the rinse liquid nozzle 13 starts discharge of pure water. Thereby, pure water is discharged from the rinse liquid nozzle 13 toward the upper surface center portion of the rotating substrate W. Pure water landing on the upper surface of the substrate W flows outward along the upper surface of the substrate W. SC1 on the substrate W is washed away by the pure water discharged from the rinse liquid nozzle 13. Thereby, a liquid film of pure water covering the entire upper surface of the substrate W is formed. When a predetermined time passes after opening of the first rinse liquid valve 15, the first rinse liquid valve 15 is closed and the discharge of pure water is stopped.

Meanwhile, the second rinse liquid valve 18 is opened, and the lower surface nozzle 16 starts discharge of pure water. Thereby, pure water is discharged from the lower surface nozzle 16 toward the lower surface center portion of the rotating substrate W. The second rinse liquid valve 18 may be opened at the same time as the first rinse liquid valve 15 or may be opened before or after the first rinse liquid valve 15 is opened. Pure water landing on the lower surface of the substrate W flows outward along the lower surface of the substrate W. A mist, etc., of the SC1 adhered to the lower surface of the substrate W is washed away by the pure water discharged from the lower surface nozzle 16. When a predetermined time passes after opening of the second rinse liquid valve 18, the second rinse liquid valve 18 is closed and the discharge of pure water is stopped.

Next, as shown in FIG. 10D, a solvent supply step (Step S7 of FIG. 9) of supplying IPA (liquid) serving as an example of an organic solvent to the substrate W, and a second heating step (Step S8 of FIG. 9) of heating IPA on the substrate W and the substrate W are performed in parallel.

Regarding the solvent supply step, the fourth nozzle moving mechanism 25 moves the solvent nozzle 19 from the standby position to the processing position, and the guard raising/lowering unit causes the splash guard 28 which is different from that in the first and second chemical liquid supply steps to face the outer circumferential portion of the substrate W. After that, the solvent valve 21 is opened, and the solvent nozzle 19 starts discharge of IPA. Thereby, IPA is discharged from the solvent nozzle 19 toward the upper surface center portion of the rotating substrate W. IPA landing on the upper surface of the substrate W flows outward along the upper surface of the substrate W. The liquid film of pure water on the substrate W is replaced with a liquid film of IPA covering the entire upper surface of the substrate W. When a predetermined time passes after opening of the solvent valve 21, the solvent valve 21 is closed and the discharge of the solvent is stopped.

Regarding the second heating step, the controller 3 starts the supply of electric power to the heating coil 73. As long as the substrate W and IPA on the substrate W are heated by the heat generating member 72, the supply of electric power may be started at the same time as the opening of the solvent valve 21 or may be started before or after the solvent valve 21 is opened. When the supply of electric power to the heating coil 73 is started, the alternating magnetic field is generated in the vicinity of the heating coil 73, and the heat generating member 72 generates heat. Thereby, heating of the substrate W is started. When a predetermined time passes after the start of the supply of electric power, the supply of electric power to the heating coil 73 is stopped. The supply of electric power to the heating coil 73 may be continued until, for example, the substrate W dries in a drying step described below.

When the supply of electric power to the heating coil 73 is started, the heat generating member 72 immediately reaches a predetermined high temperature. Each portions of the heat generating member 72 are maintained at a temperature not less than the boiling point of IPA. The temperature of the substrate W reaches a value not less than the boiling point of IPA in a state where the entire upper surface of the substrate W is covered by the liquid film of IPA. Thereby, IPA is evaporated on an interface between IPA and the upper surface of the substrate W, and a gas layer is formed between the liquid film of IPA and the upper surface of the substrate W. At this time, the liquid film of IPA is floated up from the upper surface of the substrate W. Thus, friction resistance acting on the liquid film of IPA on the substrate W is so small that the friction resistance can be regarded as zero. Therefore, the liquid film of IPA is in a state of being easily slid along the upper surface of the substrate W. The liquid film of IPA is removed from the substrate W in an IPA removal step described below.

Figure 10E:
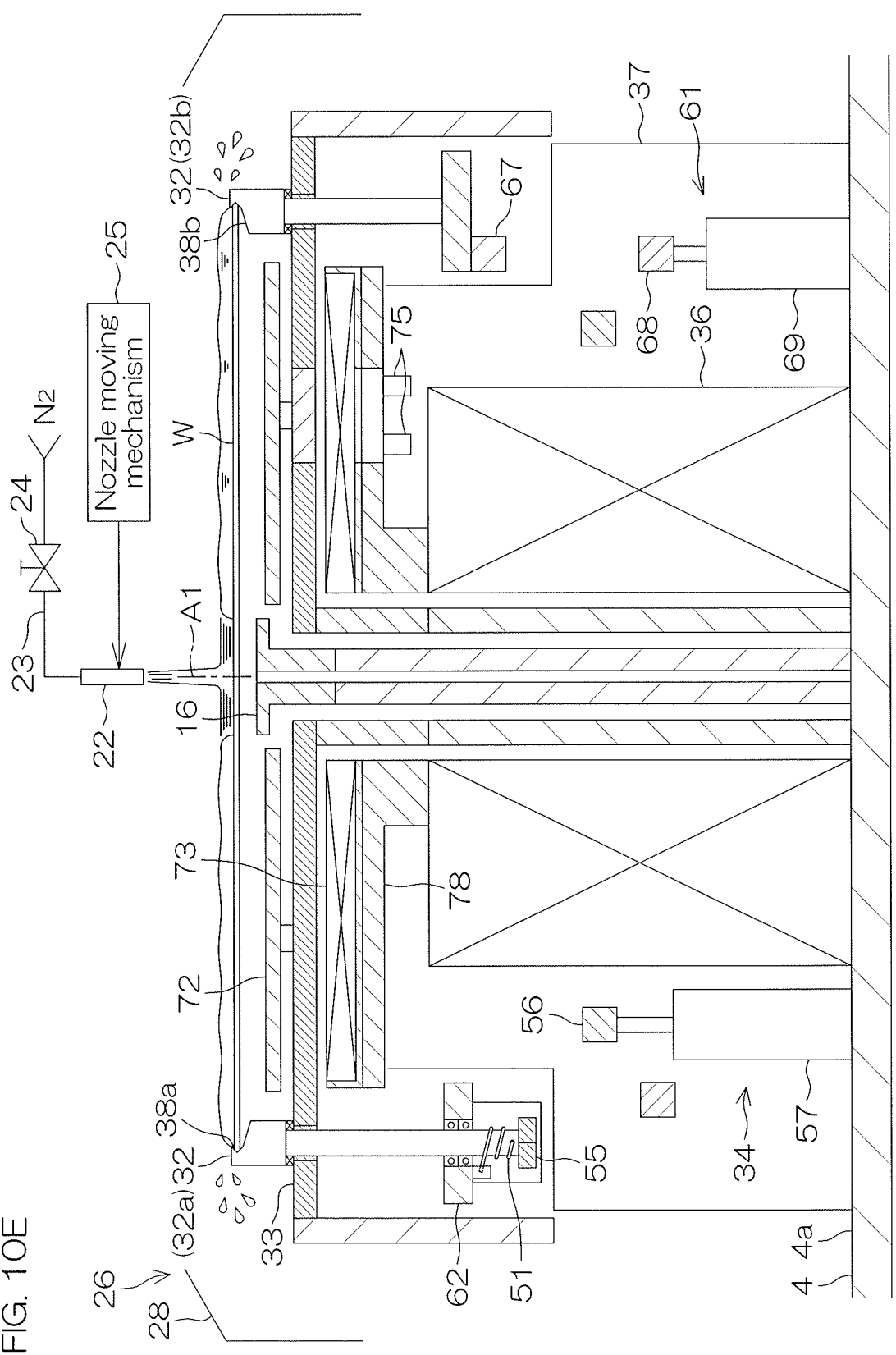
FIG. 10E is a schematic view showing a state where IPA is removed from the substrate in the example of the processing of the substrate shown in FIG. 9.

After the solvent supply step is performed, as shown in FIG. 10E, the IPA removal step (Step S9 of FIG. 9) of removing IPA from above the substrate W is performed.

Specifically, the gas nozzle 22 is already arranged at the processing position in the solvent supply step. In this state, the gas valve 24 is opened and the gas nozzle 22 starts discharge of nitrogen gas. The gas nozzle 22 discharges nitrogen gas toward the upper surface of the substrate W covered by the liquid film of IPA. The spin motor 36 accelerates the substrate W in the rotation direction and rotates the substrate W at removal rotation speed larger than those in the IPA supply step. When the substrate W is rotated at the removal rotation speed while the gas nozzle 22 is discharging nitrogen gas, the substrate W may be accelerated at the same time as opening of the gas valve 24 or may be accelerated before or after the gas valve 24 is opened. The discharge of nitrogen gas is continued until the substrate W dries in the drying step described below.

The gas nozzle 22 discharges nitrogen gas toward a blowing position in the upper surface of the substrate W in a state where the gas layer is formed between the liquid film of IPA and the upper surface of the substrate W. The IPA at the blowing position is pushed away to a periphery of the blowing position by supply of nitrogen gas. Thereby, a drying region is formed at the blowing position. Further, IPA pushed by nitrogen gas is moved from the blowing position to the periphery of the blowing position. Thus, with the supply of nitrogen gas as a trigger, an outward flow to the outer circumferential portion of the substrate W is formed in the liquid film of IPA. Further, since the substrate W is accelerated in the rotation direction in parallel to the supply of nitrogen gas, this flow is facilitated by centrifugal force. Thereby, the liquid film of IPA on the substrate W is not divided into a large number of small droplets but eliminated from the substrate W remaining as a mass. Therefore, it is possible to quickly eliminate the liquid film of IPA floated up from the substrate W from the substrate W in a short time.

Next, as shown in FIG. 10F, the drying step (Step S10 of FIG. 9) of drying the substrate W by shaking off the liquid adhered to the substrate W by centrifugal force is performed.

Specifically, the spin motor 36 accelerates the substrate W in the rotation direction, and rotates the substrate W at high rotation speed (for example, several thousand rpm) higher than the removal rotation speed. Thereby, large centrifugal force is applied to the liquid adhered to the substrate W, and the liquid is shaken off the substrate W to a periphery of the substrate. Further, since the heat generating member 72 continues to generate heat, evaporation of the liquid on the substrate W is facilitated. Similarly, since the gas nozzle 22 continues to discharge nitrogen gas, the evaporation of the liquid on the substrate W is facilitated. Thereby, the substrate W dries in a short time. When a predetermined time passes after start of high-speed rotation of the substrate W, the spin motor 36 stops rotation. The supply of electric power to the heating coil 73 is also stopped, and the gas valve 24 is closed.

Next, a carry-out step (Step S11 of FIG. 9) of carrying the substrate W out of the chamber 4 is performed.

Specifically, all the splash guards 28 are arranged at the lower position, and all the movable nozzles including the first chemical liquid nozzle 5 are arranged at the standby position. Further, all the chuck members 32 are arranged at the upper position, and all the movable chucks 32a are arranged at the open position. When the movable chucks 32a are moved to the open position, the substrate W is separated from the gripping portions 38a of the chuck members 32 and supported by the supporting portions 38b of the chuck members 32. In this state, the transfer robot R1 causes the hand H1 to enter between the substrate W and the heat generating member 72 and raises the hand H1. In a process of raising the hand H1, the substrate W is separated from the supporting portions 38b of all the chuck members 32 and supported by the hand H1 of the transfer robot R1. After that, the transfer robot R1 retracts the hand H1 from the inside of the chamber 4 while supporting the substrate W with the hand H1. Thereby, the substrate W is carried out of the chamber 4.

As described above, in the present preferred embodiment, the substrate W is gripped by the plurality of chuck members 32. The motive power of the spin motor 36 is transmitted to the plurality of chuck members 32 via the spin base 33 located under the substrate W. Thereby, the substrate W is rotated about the rotation axis A1. The IH circuit 74 of the IH heating mechanism 71 supplies electric power to the heating coil 73 when the substrate W is rotating. Thereby, the alternating magnetic field is generated and applied to the heat generating member 72, and the heat generating member 72 generates heat. The processing fluid that processes the substrate W is supplied to the rotating substrate W. Thereby, it is possible to uniformly process the substrate W.

Since the heat generating member 72 is heated by induction heating, there is no need for connecting a wire or a connector that supplies electric power to the heat generating member 72 to the heat generating member 72. Therefore, the rotation speed of the substrate W is not limited by such a structure. Further, the heat generating member 72 that heats the substrate W is arranged not inside the spin base 33 but between the substrate W and the spin base 33. Therefore, in comparison to a case where a heat generating member 72 is arranged inside a spin base 33, it is possible to shorten the gap between the substrate W and the heat generating member 72 and to enhance heating efficiency of the substrate W.

In the present preferred embodiment, the heating coil 73 is arranged near the spin base 33. That is, as shown in FIG. 7, the up-down direction gap D2 between the heating coil 73 and the spin base 33 is narrower than the thickness T2 of the heating coil 73. The heating coil 73 is arranged under the spin base 33, and the heat generating member 72 is arranged above the spin base 33. When the heating coil 73 is brought close to the spin base 33, a distance from the heating coil 73 to the heat generating member 72 is shortened. Thereby, the alternating magnetic field applied to the heat generating member 72 is strengthened. Thus, it is possible to efficiently convert electric power supplied to the heating coil 73 into heat of the heat generating member 72.

In the present preferred embodiment, the thickness T3 of the spin base 33 is reduced. That is, the thickness T3 of the spin base 33 is smaller than the thickness T2 of the heating coil 73. When the spin base 33 is thick, not only is the distance from the heating coil 73 to the heat generating member 72 increased but the alternating magnetic field applied to the heat generating member 72 is also weakened. Therefore, by reducing the thickness T3 of the spin base 33, it is possible to efficiently increase the temperature of the heat generating member 72.

In the present preferred embodiment, no other members are placed between the substrate W and the heat generating member 72, and the heat generating member 72 directly face the substrate W. Therefore, the heat of the heat generating member 72 is efficiently transmitted to the substrate W. Thereby, it is possible to enhance the heating efficiency of the substrate W.

In the present preferred embodiment, the gap changing mechanism 61 relatively moves the plurality of chuck members 32 and the heat generating member 72 in the up-down direction. Thereby, the up-down direction gap between the substrate W gripped by the plurality of chuck members 32 and the heat generating member 72 is changed. Therefore, it is possible to change a distance from the heat generating member 72 to the substrate W according to necessity.

In the present preferred embodiment, in a retracted state where the plurality of chuck members 32 are placed at the upper position serving as the retracted position, the transfer robot R1 places the substrate W supported on the hand H1 onto the plurality of chuck members 32. Next, the transfer robot R1 lowers and separates the hand H1 from the substrate W. After that, the transfer robot R1 retracts the hand H1 from a space between the substrate W and the heat generating member 72. When the substrate W is taken from the plurality of chuck members 32, the hand H1 is inserted into the space between the substrate W and the heat generating member 72 in the retracted state. After that, the transfer robot R1 raises the hand H1. Thereby, the substrate W is separated from the plurality of chuck members 32 and supported by the hand H1.

From the viewpoint of heating efficiency, the heat generating member 72 is preferably arranged near the substrate W. However, when the heat generating member 72 is too close to the substrate W, the hand H1 cannot enter the space between the substrate W and the heat generating member 72. Thus, the substrate W cannot be placed on the plurality of chuck members 32 or cannot be taken from the plurality of chuck members 32. As described above, the substrate W is transferred in the retracted state. Meanwhile, the substrate W is heated in a proximate state where the plurality of chuck members 32 are placed at the lower position serving as the proximate position. Therefore, without lowering the heating efficiency of the substrate W, it is possible to transfer the substrate W.

In the present preferred embodiment, the plurality of chuck members 32 include the movable chuck 32a movable between the closed position and the open position with respect to the spin base 33. The up-down direction gap between the substrate W and the heat generating member 72 is changed by moving the plurality of chuck members 32 in the up-down direction with respect to the spin base 33. Therefore, the movable chuck 32a is not only movable between the closed position and the open position with respect to the spin base 33 but also movable in the up-down direction with respect to the spin base 33. In such a way, there is no need for moving the heat generating member 72 in the up-down direction in order to change the up-down direction gap between the substrate W and the heat generating member 72. Thus, it is possible to simplify a structure of supporting the heat generating member 72.

In the present preferred embodiment, the outer wall portion 77a of the magnetic shielding member 77 that absorbs magnetism surrounds the heating coil 73. Further, the lower wall portion 77b of the magnetic shielding member 77 that absorbs magnetism is located under the heating coil 73. Therefore, it is possible to suppress or eliminate the influence of the alternating magnetic field on the members placed around the heating coil 73. Similarly, it is possible to suppress or eliminate the influence of the alternating magnetic field on the members located under the heating coil 73.

In the present preferred embodiment, the detection value of thermometer 75 that detects the temperature of the heat generating member 72 is in input to the controller 3. The controller 3 controls the electric power to be supplied to the heating coil 73 based on this detection value. Thereby, it is possible to bring the temperature of the heat generating member 72 close to the target temperature with a high degree of accuracy.

In the present preferred embodiment, the lower surface nozzle 16 discharges the processing fluid toward the lower surface of the substrate W. The lower surface nozzle 16 is arranged, in a plan view, within a through hole 72c passing through the center portion of the heat generating member 72 in the up-down direction. Therefore, it is possible to suppress or prevent the heat generating member 72 from obstructing the processing fluid discharged from the lower surface nozzle 16. Thereby, it is possible to reliably supply the processing fluid to the lower surface of the substrate W.

In the present preferred embodiment, the movable chuck 32a is turned about the vertical chuck turning axis A2. In this case, in comparison to a case where the chuck turning axis A2 is a horizontal straight line, the volume of a passage space through which the movable chuck 32a passes is easily reduced. In particular, in a case where the chuck turning axis A2 matches the center line of the movable chuck 32a, it is possible to make the volume of the passage space match or substantially match the volume of the movable chuck 32a.

Second Preferred Embodiment

Next, a second preferred embodiment of the present invention will be described. A major difference of the second preferred embodiment from the first preferred embodiment is that in place of the driven magnets 55 and the drive magnet 56, pushers 284 that press movable chucks 32a to an open position are provided in a chuck opening/closing mechanism 34.

Figure 11:
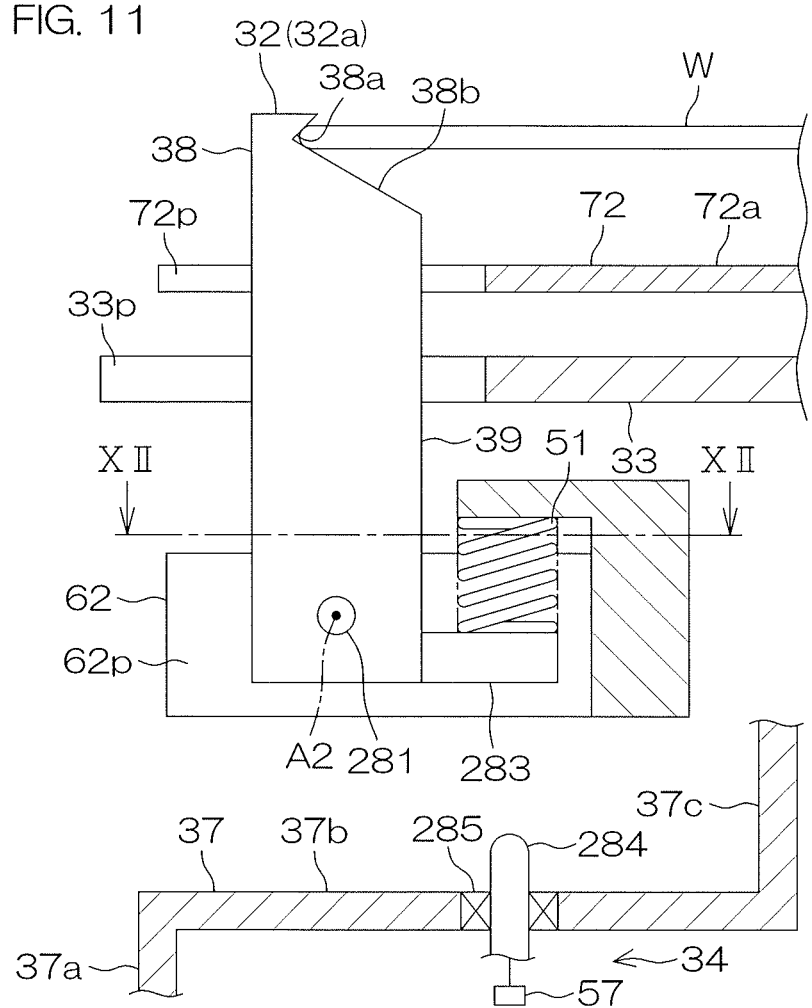
FIG. 11 is a schematic view showing a vertical section which includes a movable chuck according to a second preferred embodiment of the present invention.
Figure 12:
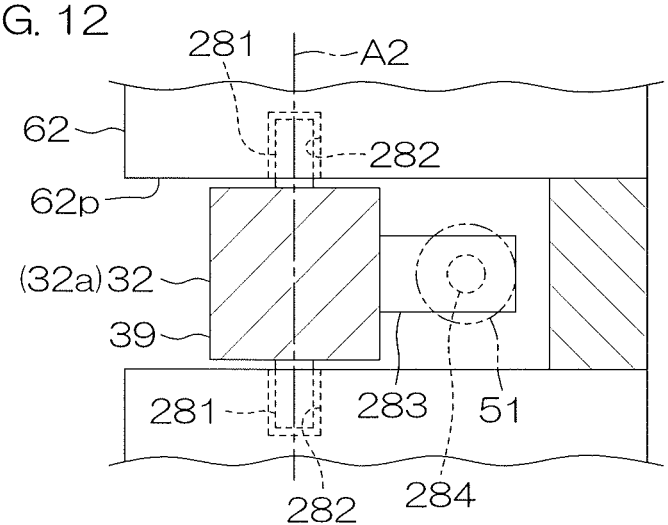
FIG. 12 is a schematic view showing a horizontal section taken along line XII-XII in FIG. 11.

FIG. 11 is a schematic view showing a vertical section which includes the movable chuck 32a according to the second preferred embodiment of the present invention. FIG. 12 is a schematic view showing a horizontal section taken along line XII-XII in FIG. 11. In FIGS. 11 to 12, components identical to those shown in FIGS. 1 to 10F described above are denoted by the same reference signs in FIG. 1, etc. and the description thereof will be omitted. FIG. 11 shows a state where the movable chuck 32a is arranged at a closed position and an upper position.

The movable chuck 32a is supported by a raising/lowering member 62 via support shafts 281 extending horizontally and support holes 282 into which the support shafts 281 are inserted, respectively. The support shafts 281 are provided on the movable chuck 32a, and the support holes 282 are provided in the raising/lowering member 62. The support shafts 281 may be provided on the raising/lowering member 62 and the support holes 282 may be provided in the movable chuck 32a.

The pair of support shafts 281 extends from the movable chuck 32a in the opposite directions. The pair of support shafts 281 is placed on the same straight line. The support shafts 281 extend horizontally in a direction tangential to a circle surrounding a rotation axis A1 (refer to FIG. 2). The support holes 282 are recessed from an inner surface of a through portion 62p provided in the raising/lowering member 62. The pair of support shafts 281 is inserted into the pair of support holes 282, respectively.

The movable chuck 32a is movable about a horizontal chuck turning axis A2 corresponding to the center line of the support shafts 281 with respect to the raising/lowering member 62. An upper end portion of the movable chuck 32a is moved in the radial direction in accordance with turning of the movable chuck 32a about the chuck turning axis A2. The through portion 62p of the raising/lowering member 62 is a notch extending inward from an outer circumferential surface of the raising/lowering member 62. Similarly, a through portion 33p of a spin base 33 is a notch extending inward from an outer circumferential surface of the spin base 33. The through portion 62p and the through portion 33p may be through holes whose entire circumferences are closed.

The movable chuck 32a includes an inward projecting portion 283 extending inward from a base shaft 39. A coil spring 51 of the chuck opening/closing mechanism 34 is arranged above the inward projecting portion 283. One end portion of the coil spring 51 is held by a holding portion 53 fixed with respect to the raising/lowering member 62. The other end portion of the coil spring 51 is held by the inward projecting portion 283. The coil spring 51 holds the movable chuck 32a at an original position. When the movable chuck 32a is turned from the original position toward the open position (to the left side in FIG. 11), the coil spring 51 is elastically deformed and a restoring force is generated to return the movable chuck 32a to the original position. Thereby, force to move the movable chuck 32a to the closed position is generated.

The chuck opening/closing mechanism 34 includes a plurality of pushers 284 that press the plurality of movable chucks 32a to the open position. Each of the pushers 284 is arranged on the lower side of the inward projecting portion 283. The pusher 284 is inserted into a through hole passing through a chuck housing 37. A clearance between an outer circumferential surface of the pusher 284 and an inner circumferential surface of the through hole is tightly closed by an annular seal 285 that surrounds the pusher 284. A tip end surface of the pusher 284 is arranged out of the chuck housing 37. The tip end surface of the pusher 284 is directed upward. FIG. 11 shows an example in which the tip end surface of the pusher 284 has a semispherical shape. The tip end surface of the pusher 284 may be a flat surface.

The plurality of pushers 284 are connected to an opening/closing actuator 57. The opening/closing actuator 57 moves the plurality of pushers 284 in the up-down direction between an upper position and a lower position. FIG. 11 shows a state where the pusher 284 is arranged at the lower position. When a rotation angle of the spin base 33 is a transfer angle, the plurality of pushers 284 overlap with the plurality of inward projecting portions 283, respectively in a plan view. In this state, when the opening/closing actuator 57 moves the pushers 284 to the upper position, tip ends of the pushers 284 are abutted with lower surfaces of the inward projecting portions 283 and the inward projecting portions 283 are pressed upward. Thereby, the movable chucks 32a are turned to the open position and arranged at the open position. When the opening/closing actuator 57 moves the pushers 284 downward from the upper position, the pushers 284 are separated from the movable chucks 32a, and the movable chucks 32a are turned toward the original position by the restoring force of the coil springs 51.

When a transfer robot R1 (refer to FIG. 3) places a substrate W on the plurality of chuck members 32, a raising/lowering actuator 69 (refer to FIG. 2) places all the chuck members 32 at an upper position. The spin base 33 is arranged at a transfer position at which the rotation angle of the spin base 33 is the transfer angle. In this state, the opening/closing actuator 57 moves the pushers 284 to the upper position. Thereby, all the movable chucks 32a are arranged at the open position.

The transfer robot R1 places the substrate W supported on the hand H1 onto supporting portions 38b of the plurality of chuck members 32 in a state where all the chuck members 32 are placed at the upper position and all the movable chucks 32a are arranged at the open position. After that, the opening/closing actuator 57 moves the pushers 284 to the lower position. The movable chucks 32a are pressed against the outer circumferential portion of the substrate W when returning to the original position by the restoring force of the coil springs 51. Thereby, the movable chucks 32a are arranged at the closed position between the open position and the original position, and the substrate W is gripped by gripping portions 38a of the plurality of chucks.

As described above, in the present preferred embodiment, when the opening/closing actuator 57 of the chuck opening/closing mechanism 34 raises the pushers 284 serving as an example of a pressing portion to the upper position, the pushers 284 are brought into contact with the inward projecting portions 283 serving as an example of a pressed portion, and press the inward projecting portions 283 upward. Thereby, the movable chucks 32a are arranged at the open position. After that, when the opening/closing actuator 57 lowers the pushers 284 from the upper position, the pushers 284 are separated downward from the inward projecting portions 283, and the movable chucks 32a are returned to the closed position. Thereby, it is possible to move the movable chucks 32a between the closed position and the open position.

Third Preferred Embodiment

Next, a third preferred embodiment of the present invention will be described. A major difference of the third preferred embodiment from the second preferred embodiment is that the raising/lowering actuator 69 also serves as the opening/closing actuator 57.

Figure 13:
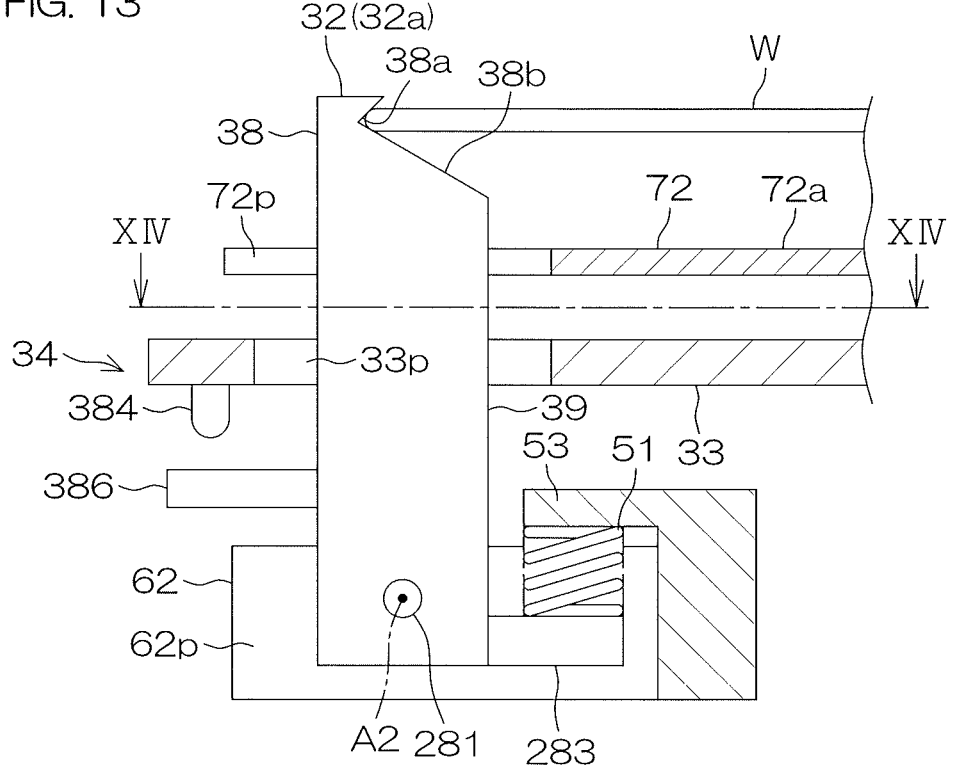
FIG. 13 is a schematic view showing a vertical section which includes a movable chuck according to a third preferred embodiment of the present invention.
Figure 14:
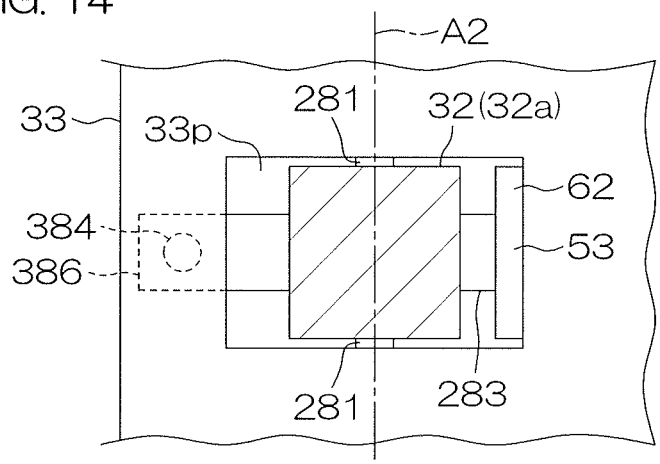
FIG. 14 is a schematic view showing a horizontal section taken along line XIV-XIV in FIG. 13.

FIG. 13 is a schematic view showing a vertical section which includes a movable chuck 32a according to the third preferred embodiment of the present invention. FIG. 14 is a schematic view showing a horizontal section taken along line XIV-XIV in FIG. 13. In FIGS. 13 to 14, components identical to those shown in FIGS. 1 to 12 described above are denoted by the same reference signs in FIG. 1, etc. and the description thereof will be omitted. FIG. 13 shows a state where the movable chuck 32a is arranged at a closed position and a lower position.

As shown in FIG. 13, pushers 384 of the chuck opening/closing mechanism 34 extend downward from the lower surface of a spin base 33. The pushers 384 are fixed to the spin base 33. A tip end surface of each of the pushers 384 is directed downward. The pusher 384 is placed around the through portion 33p of the spin base 33. The through portion 33p is a through hole whose entire circumference is closed. The pusher 384 is placed above an outer projecting portion 386 extending outward from the base shaft 39. As shown in FIG. 14, even when the movable chuck 32a is placed at any position around the chuck turning axis A2, the pusher 384 overlaps with the outward projecting portion 386 in a plan view. The plurality of pushers 384 face the plurality of outward projecting portions 386, respectively in the up-down direction.

When the transfer robot R1 (refer to FIG. 3) places a substrate W on the plurality of chuck members 32, the raising/lowering actuator 69 (refer to FIG. 2) raises the raising/lowering member 62 and the movable chucks 32a to an upper position. In this process, the outward projecting portions 386 of the movable chucks 32a are pressed downward by the pushers 384, and the movable chucks 32a are turned to an open position. When the movable chucks 32a reach the upper position, the movable chucks 32a are arranged at the open position. The transfer robot R1 places the substrate W supported on the hand H1 onto the supporting portions 38b of the plurality of chuck members 32 in this state.

After the substrate W is placed on the plurality of chuck members 32, the raising/lowering actuator 69 lowers the raising/lowering member 62 and the movable chucks 32a to the lower position. Thereby, the outward projecting portions 386 are separated downward from the pushers 384, and the movable chucks 32a are turned toward an original position by the restoring force of coil springs 51. The movable chucks 32a are pressed against the outer circumferential portion of the substrate W when returning to the original position. Thereby, the movable chucks 32a are arranged at the closed position between the open position and the original position, and the substrate W is gripped by gripping portions 38a of the plurality of chucks.

As described above, in the present preferred embodiment, when the raising/lowering actuator 69 raises the plurality of chuck members 32 to the upper position, the outward projecting portions 386 serving as an example of the pressed portion are brought into contact with the pushers 384 serving as an example of the pressing portion and pressed downward. Thereby, the movable chucks 32a are arranged at the open position. After that, when the raising/lowering actuator 69 lowers the plurality of chuck members 32 from the upper position, the outward projecting portions 386 are separated downward from the pushers 384, and the movable chucks 32a are returned to the closed position. In such a way, the raising/lowering actuator 69 that raises and lowers the plurality of chuck members 32 with respect to the spin base 33 also serves as the opening/closing actuator 57 (refer to FIG. 2) that moves the movable chucks 32a. Thus, an exclusive opening/closing actuator 57 is not required.

Fourth Preferred Embodiment

Next, a fourth preferred embodiment of the present invention will be described. A major difference of the fourth preferred embodiment from the first preferred embodiment is that not the plurality of chuck members 32 but the heat generating member 72 is raised and lowered.

Figure 15:
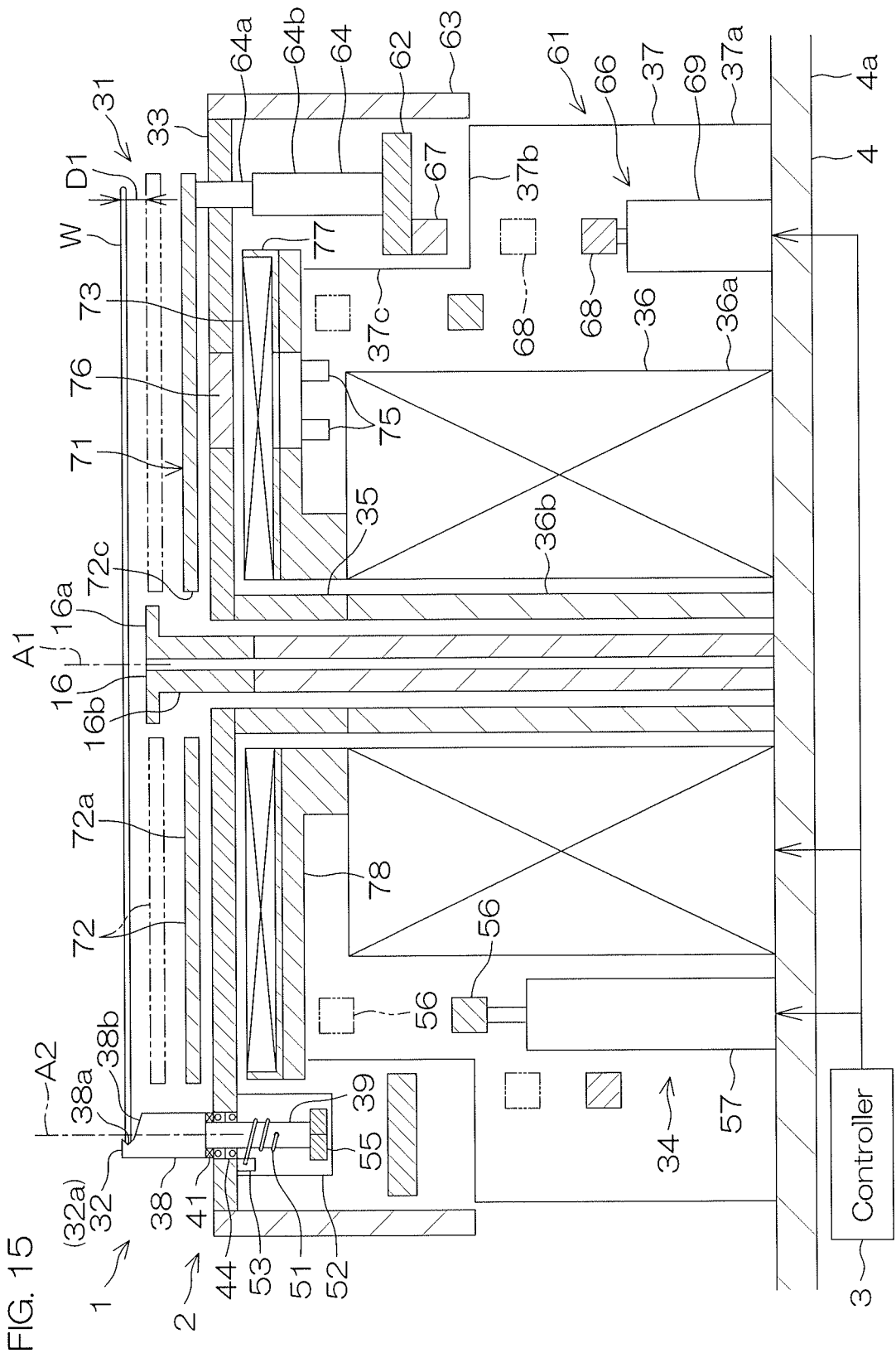
FIG. 15 is a schematic view showing a vertical section of a spin chuck according to a fourth preferred embodiment of the present invention.

FIG. 15 is a schematic view showing a vertical section of the spin chuck 31 according to the fourth preferred embodiment of the present invention. In FIG. 15, components identical to those shown in FIGS. 1 to 14 described above are denoted by the same reference signs in FIG. 1, etc. and the description thereof will be omitted.

the movable chucks 32a are held by the spin base 33. Each of the movable chucks 32a is turnable about the chuck turning axis A2 with respect to the spin base 33, and incapable of moving in the up-down direction with respect to the spin base 33. The casing 52 that accommodates the coil spring 51 and the driven magnet 55 is attached to the spin base 33. The holding portion 53 that holds one end portion of the coil spring 51 is fixed with respect to the spin base 33. Although not shown, the fixed chucks 32b (refer to FIG. 3) are fixed to the spin base 33.

The raising/lowering member 62 is arranged under the casing 52. An upper position of the raising/lowering member 62 is a position separated downward from the casing 52. The raising/lowering member 62 is raised and lowered together with the plurality of guide members 64. The guide stoppers 64b extend upward from an upper surface of the raising/lowering member 62, and the guide shafts 64a extend upward from the guide stoppers 64b. The guide shafts 64a are inserted into through holes passing through the spin base 33 in the up-down direction. The guide stoppers 64b are arranged under the spin base 33. An upward movement of the raising/lowering member 62 with respect to the spin base 33 is restricted by contact between the guide stoppers 64b and the spin base 33.

The heat generating member 72 is supported by the guide shafts 64a. The heat generating member 72 is fixed to upper end portions of the guide shafts 64a. The heat generating member 72 is raised and lowered together with the raising/lowering member 62. Leg portions 72b (refer to FIG. 2) to be placed between the plate-shaped portion 72a of the heat generating member 72 and the spin base 33 are omitted from the heat generating member 72. The raising/lowering member 62, the guide members 64, and the heat generating member 72 are movable in the up-down direction with respect to the spin base 33.

The heat generating member 72 is moved in the up-down direction between an upper position (position shown by a two short dashes line in FIG. 15) and a lower position (position shown by a solid line in FIG. 15) in accordance with raising and lowering of the raising/lowering member 62. When the heat generating member 72 is placed at the upper position, the distance D1 from the upper surface of the heat generating member 72 to the lower surface of the substrate W gripped by gripping portions 38a of the plurality of chuck members 32 is shorter than the thickness T1 of the hand H1 of the transfer robot R1. On the other hand, when the heat generating member 72 is placed at the lower position, the distance D is longer than the thickness T1 of the hand H1.

When the transfer robot R1 places the substrate W on the plurality of chuck members 32, the raising/lowering actuator 69 places the heat generating member 72 at the lower position serving as a retracted position. Further, an opening/closing actuator 57 places all the movable chucks 32a at the open position. In this state, the transfer robot R1 places the substrate W supported on the hand H1 onto supporting portions 38b of the plurality of chuck members 32. After that, the opening/closing actuator 57 moves all the movable chucks 32a to the closed position. Thereby, the substrate W is gripped by the gripping portions 38a of the plurality of chuck members 32. The raising/lowering actuator moves the heat generating member 72 to the upper position serving as a proximate position after the hand H1 of the transfer robot R1 is retracted from the upper side of the heat generating member 72.

As described above, in the present preferred embodiment, the plurality of chuck members 32 include the movable chuck 32a movable between the closed position and the open position with respect to the spin base 33. An up-down direction gap between the substrate W and the heat generating member 72 is changed by moving the heat generating member 72 in the up-down direction with respect to the spin base 33. In such a way, there is no need for moving the plurality of chuck members 32 in the up-down direction in order to change the up-down direction gap between the substrate W and the heat generating member 72. Thus, it is possible to simplify a structure of supporting the plurality of chuck members 32.

Other Preferred Embodiments

The present invention is not limited to the contents of the preferred embodiments described above, and can be variously modified.

For example, the up-down direction gap D2 between the heating coil 73 and the spin base 33 may be equal to the thickness T2 of the heating coil 73 or may be wider than the thickness T2 of the heating coil 73.

The thickness T3 of the spin base 33 may be equal to the thickness T2 of the heating coil 73 or may be larger than the thickness T2 of the heating coil 73.

The thickness of the plate-shaped portion 72a of the heat generating member 72 may be equal to the thickness T3 of the spin base 33 or may be larger than the thickness T3 of the spin base 33.

The heat generating member 72 may indirectly face the substrate W gripped by the plurality of chuck members 32. That is, another member may be arranged between the heat generating member 72 and the substrate W.

The gap changing mechanism 61 that changes the gap between the substrate W and the heat generating member 72 may be omitted. That is, a gap between a gripping position where the substrate W gripped by the plurality of chuck members 32 is arranged and the heat generating member 72 may be fixed.

If there is no influence on the members other than the heating coil 73 such as the chuck opening/closing mechanism 34, the magnetic shielding member 77 that shields the alternating magnetic field may be omitted.

The controller 3 may change a command value of the alternating current flowing through the heating coil 73 without referring to the detection values of thermometers 75 in order to match the temperature of the heat generating member 72 with the target temperature. That is, thermometers 75 may be omitted.

If there is no need for supplying the processing fluid to the lower surface of the substrate W, the lower surface nozzle 16 may be omitted. In this case, the through hole passing through the center portion of the heat generating member 72 in the up-down direction may be omitted. Similarly, the through hole passing through the center portion of the spin base 33 in the up-down direction may be omitted.

The drive magnet 56 of the chuck opening/closing mechanism 34 may have an arc shape in a plan view. In this case, the movable chucks 32a are opened and closed when the spin base 33 is placed at the transfer position (transfer angle) where the drive magnet 56 faces all of the driven magnets 55 in the radial direction in a plan view.

The drive magnet 68 of the raising/lowering drive unit 66 may have an arch shape in a plan view. In this case, the raising/lowering member 62 is raised and lowered when the spin base 33 is placed at the transfer position (transfer angle) where the drive magnet 68 is located under the driven magnet 67.

In the example of the processing of the substrate W described above, the case where both the first heating step (Step S3 of FIG. 9) and the second heating step (Step S8 of FIG. 9) are executed is described. However, one of the first heating step and the second heating step may be omitted.

In place of the coil springs 51 that move the movable chucks 32a to the closed position, closing magnets that add a magnetic field to the driven magnets 55 so that the movable chucks 32a are moved to the closed position may be used. In this case, the closing magnets are arranged in the casings 52.

The substrate processing apparatus 1 may be an apparatus that processes a polygonal substrate W.

Two or more of any of the arrangements described above may be combined.

The present application corresponds to Japanese Patent Application No. 2016-186148 filed on Sep. 23, 2016 in the Japan Patent Office, and the entire disclosure of this application is incorporated herein by reference.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

DESCRIPTION OF THE REFERENCE NUMERALS

1: Substrate processing apparatus
3: Controller
5: First chemical liquid nozzle (processing fluid supply unit)
9: Second chemical liquid nozzle (processing fluid supply unit)
13: Rinse liquid nozzle (processing fluid supply unit)
16: Lower surface nozzle (processing fluid supply unit)
19: Solvent nozzle (processing fluid supply unit)
22: Gas nozzle (processing fluid supply unit)
32: Chuck member
32a: Movable chuck
32b: Fixed chuck
33: Spin base
34: Chuck opening/closing mechanism
35: Spin shaft
36: Spin motor
38a: Gripping portion
38b: Supporting portion
51: Coil spring
55: Driven magnet
56: Drive magnet
57: Opening/closing actuator
61: Gap changing mechanism
62: Raising/lowering member
66: Raising/lowering drive unit
67: Driven magnet
68: Drive magnet
69: Raising/lowering actuator
71: IH heating mechanism
72: Heat generating member
72a: Plate-shaped portion
72b: Leg portion
73: Heating coil
74: IH circuit
75: Thermometer
76: Transparent member
77: Magnetic shielding member
77a: Outer wall portion
77b: Lower wall portion
283: Inward projecting portion (pressed portion)
284: Pusher (pressing portion)
384: Pusher (pressing portion)
386: Outward projecting portion (pressed portion)
A1: Rotation axis
A2: Chuck turning axis
D1: Distance from heat generating member to substrate
D2: Up-down direction gap between heating coil and spin base
H1: Hand
R1: Transfer robot
T1: Thickness of hand
T2: Thickness of heating coil
T3: Thickness of spin base
W: Substrate

What is claimed is:

1. A substrate processing apparatus comprising:
a plurality of chuck members that grip a substrate horizontally by horizontally clamping the substrate with a plurality of gripping portions arranged around the substrate;
a spin motor that generates motive power to rotate the substrate about a vertical rotation axis passing through a center portion of the substrate gripped by the plurality of chuck members;
a spin base that is arranged under the substrate gripped by the plurality of chuck members and transmits the motive power of the spin motor to the plurality of chuck members;
a processing fluid supply unit that supplies at least one of an upper surface and a lower surface of the substrate with a processing fluid with which the substrate gripped by the plurality of chuck members is processed; and
an IH (induction heating) heating mechanism that includes a heat generating member arranged between the substrate gripped by the plurality of chuck members and the spin base, a heating coil arranged under the spin base, and an IH (induction heating) circuit that causes the heating coil to generate an alternating magnetic field to be applied to the heat generating member by supplying electric power to the heating coil such that the heat generating member generates Joule heat responsive to generation of eddy currents within the heat generating member when the alternating magnetic field is applied to the heat generating member.

2. The substrate processing apparatus according to claim 1, wherein
a gap between the heating coil and the spin base in an up-down direction is narrower than a thickness of the heating coil.

3. The substrate processing apparatus according to claim 1, wherein
a thickness of the spin base is smaller than a thickness of the heating coil.

4. The substrate processing apparatus according to claim 1, wherein
the heat generating member directly faces the substrate gripped by the plurality of chuck members.

5. The substrate processing apparatus according to claim 1, further comprising:
a gap changing mechanism that changes a gap between the substrate gripped by the plurality of chuck members and the heat generating member in an up-down direction by moving the plurality of chuck members or the heat generating member in the up-down direction.

6. The substrate processing apparatus according to claim 5, further comprising:
a transfer robot that transfers the substrate to the plurality of chuck members while supporting the substrate with a hand arranged under the substrate, wherein
the gap changing mechanism moves the plurality of chuck members or the heat generating member in the up-down direction between a retracted position where the gap between the substrate gripped by the plurality of chuck members and the heat generating member in the up-down direction is wider than a thickness of the hand, and a proximate position where the gap is narrower than the thickness of the hand.

7. The substrate processing apparatus according to claim 5, wherein
the gap changing mechanism moves the plurality of chuck members in the up-down direction with respect to the spin base, and
the plurality of chuck members include a movable chuck that is movable with respect to the spin base between a closed position where the movable chuck is pressed against an outer circumferential portion of the substrate and an open position where the pressing of the movable chuck against the outer circumferential portion of the substrate is released.

8. The substrate processing apparatus according to claim 5, wherein
the gap changing mechanism moves the heat generating member in the up-down direction with respect to the spin base.

9. The substrate processing apparatus according to claim 1, further comprising:
a magnetic shielding member that shields the alternating magnetic field generated by supplying the electric power to the heating coil, and includes a tubular outer wall portion that surrounds the heating coil, and a lower wall portion that is located under the heating coil.

10. The substrate processing apparatus according to claim 1, further comprising:
a thermometer that detects a temperature of the heat generating member; and
a controller that controls the IH heating mechanism based on a detection value of a thermometer.

11. The substrate processing apparatus according to claim 1, wherein
the processing fluid supply unit includes a lower surface nozzle that is arranged, in a plan view, within a through hole passing through the heat generating member in the up-down direction, the lower surface nozzle discharging the processing fluid toward the lower surface of the substrate gripped by the plurality of chuck members.

12. The substrate processing apparatus according to claim 1, wherein
the plurality of chuck members include a movable chuck that is movable with respect to the spin base about a vertical chuck turning axis between a closed position where the movable chuck is pressed against an outer circumferential portion of the substrate and an open position where the pressing of the movable chuck against the outer circumferential portion of the substrate is released.

13. The substrate processing apparatus according to claim 1, wherein
the plurality of chuck members include a movable chuck that is movable with respect to the spin base about a horizontal chuck turning axis between a closed position where the movable chuck is pressed against an outer circumferential portion of the substrate and an open position where the pressing of the movable chuck against the outer circumferential portion of the substrate is released.

14. The substrate processing apparatus according to claim 13, further comprising:
a chuck opening/closing mechanism that switches the plurality of chuck members between a closed state where the plurality of gripping portions are pressed against the outer circumferential portion of the substrate and an opened state where the pressing of the plurality of gripping portions against the substrate is released by moving the movable chuck between the closed position and the open position, wherein
the chuck opening/closing mechanism includes a pressing portion that moves the movable chuck to the open position by pressing the movable chuck upward or downward, and
the movable chuck includes a pressed portion to be pressed by the pressing portion.

15. The substrate processing apparatus according to claim 14, wherein
the chuck opening/closing mechanism further includes an opening/closing actuator that moves the pressing portion in an up-down direction between an upper position where the pressing portion is brought into contact with the pressed portion and a lower position where the pressing portion is separated downward from the pressed portion.

16. The substrate processing apparatus according to claim 14, further comprising:
a gap changing mechanism that changes a gap between the substrate gripped by the plurality of chuck members and the heat generating member in an up-down direction by moving the plurality of chuck members in the up-down direction with respect to the spin base, wherein
the pressing portion is coupled to the spin base such that the pressing portion is located above the pressed portion, and
the gap changing mechanism includes a raising/lowering actuator that moves the plurality of chuck members in the up-down direction with respect to the spin base between an upper position where the pressed portion is brought into contact with the pressing portion and a lower position where the pressed portion is separated downward from the pressing portion.

* * * * *